US006475630B1

(12) United States Patent
Uesugi et al.

(10) Patent No.: US 6,475,630 B1

(45) Date of Patent: Nov. 5, 2002

(54) PLANOGRAPHIC PRINTING PLATE, NON-WOVEN CLOTH ROLLER, AND METHOD AND APPARATUS FOR PRELIMINARILY POLISHING A METAL PLATE FOR PRINTING PLATE

(75) Inventors: Akio Uesugi, Shizuoka (JP); Masahiro Endo, Shizuoka (JP); Yoshinori Hotta, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/518,369

(22) Filed: Mar. 3, 2000

(30) Foreign Application Priority Data

| | | |
|---|---|---|
| Mar. 3, 1999 | (JP) | 11-056200 |
| Mar. 12, 1999 | (JP) | 11-066821 |
| Mar. 25, 1999 | (JP) | 11-082010 |

(51) Int. Cl.[7] .......... B32B 15/04; G03F 7/09; B41N 1/08

(52) U.S. Cl. .......... 428/472; 428/337; 428/469; 428/650; 428/654; 428/687; 430/278.1; 101/454; 101/459

(58) Field of Search .......... 428/654, 337, 428/469, 472, 472.2, 650, 687; 430/300, 278.1, 69, 49; 101/130, 454, 459

(56) References Cited

U.S. PATENT DOCUMENTS 5,834,129 A 11/1998 Dhillon

FOREIGN PATENT DOCUMENTS

| | | |
|---|---|---|
| EP | 0 816 118 A1 | 1/1998 |
| EP | 0 887 430 A1 | 12/1998 |
| EP | 0 960 743 A2 | 12/1999 |

OTHER PUBLICATIONS

Japanese Abstract No. 08123014, dated May 17, 1996.

Japanese Abstract No. 09211844, dated Aug. 15, 1997.

*Primary Examiner*—Deborah Jones
*Assistant Examiner*—Jennifer McNeil
(74) *Attorney, Agent, or Firm*—Sughrue Mion, PLLC

(57) ABSTRACT

The present invention provides a planographic printing plate capable of ensuring improvement of productivity and stability of a small dot net portion due to improvement of adhesion. There is provided a planographic printing plate, characterized in that a surface of an aluminum plate being a support element of the planographic printing plate has been subjected to preliminarily polishing mechanically by at least 0.1 $\mu$m; chemical etching treatment by at least 0.1 $\mu$m; electrochemically surface-roughening; and anodic oxidation, and for a surface structure of the aluminum plate: (a) an area (S) for a graphic formed by a reference straight line drawn from a top of a third highest mountain of a two-dimensional roughness curve downwardly by 1 $\mu$m and a roughness curve upper than the reference straight line is 30 $\mu m^2 \leqq S \leqq 150\ \mu m^2$; (b) an average roughness Ra of average lines is 0.15 $\mu m \leqq S \leqq Ra \leqq 0.60\ \mu m$; (c) a relationship between the average roughness Ra of average lines and a height Rp of a center line is $Rp \leqq 6Ra$; (d) a relationship between a maximum height Rmax and the average roughness Ra of average lines is $Rmax \leqq 12Ra$; and (e) a surface area difference is between 20% and 70%.

1 Claim, 1 Drawing Sheet

PLANOGRAPHIC PRINTING PLATE, NON-WOVEN CLOTH ROLLER, AND METHOD AND APPARATUS FOR PRELIMINARILY POLISHING A METAL PLATE FOR PRINTING PLATE

BACKGROUND OF THE INVENTION

1. Field of the Invention

The present invention relates to a planographic printing plate, and in particular, to a planographic printing plate in which an aluminum plate is employed as a support element. In addition, the present invention pertains to a non-woven cloth roller and a method and apparatus for preliminarily polishing a metal plate for printing plate. In particular, the present invention relates to a non-woven cloth roller for preliminarily polishing a running web-shaped metal plate for printing plate and a preliminary polishing method and apparatus using the roller.

2. Description of Related Art

In general, in order to use an aluminum plate as a support element of a planographic printing plate, it is required to have appropriate adhesive properties to a photosensitive material and water preserving properties, and further, make the plate uniformly surface-roughened. Being uniformly surface-roughened means that the sizes of produced pits are appropriately equal, and requires that such pits are uniformly produced on their full faces. In addition, the pits considerably influence dirt retardant properties, printing resistance or the like that are printing performances of a printing plate material, and its quantity is an important factor for making a printing plate. Further, in recent years, a computer system for direct plate making from digital signals or the like is becoming popular with advancement of information system. In particular, with advancement of miniaturization and high yielding of solid laser and semiconductor laser beams, such computer system is becoming rapidly popular. It is also anticipated that a planographic printing plate support element restricts laser beam halation, and provides water preserving properties, hydrophilicity, printing resistance, and dirt retardant properties which are important for a printing plate.

As a recording material for infrared-ray laser beams, in Japanese Patent Publication No. 61-48418, there is disclosed an anodic oxidation support element having at least an oxide layer of 5 to 12 g/m$^2$. In addition, in Japanese Patent Laid-Open No. 63-260491, there is proposed a surface-roughened and anode-oxidized support element in which a sol having a nuclei to be reduced to a silver complex is adhered. In U.S. Pat. No. 4,555,475, there is proposed a support element silicate-treated on a surface having an anodic oxidation skin film to form a silicate of aluminum of 2 to 8 mg/m$^2$. In EP 164128B also, there is proposed a method for graining an aluminum surface, anodic oxidation, causing silicate treatment, applying a carbon black to make a photosensitive material, thereby forming an image. Further, in Japanese Patent Laid-Open No. 10-228992, there is proposed a support element for restricting halation.

However, although the above patents are superior inventions, there has been requested further improvement of productivity and stability of small dot net portions due to improvement of adhesion.

In a web-shaped metal plate for printing plate, for example, a thin aluminum plate or aluminum alloy plate, its surface is polished, fine irregularities called grains are formed and surface-roughened, thereby improving printing adaptability of a metal plate for printing plate.

At present, a polishing method generally performed for surface-roughening of the metal plate for printing plate includes mechanical polishing employing a roller brush (for example, Japanese Patent Publication No. 50-40047); electrochemical polishing for performing electrolysis in an electrolyte; or chemical polishing for immersing in chemicals.

In the case where mechanical polishing, electrochemical polishing, or chemical polishing is carried out for a metal plate for printing plate such as aluminum plate having recesses locally, there is an abnormality that uniform surface-roughening is impossible at such recesses, thus lowering the printing performance at such portion.

As a countermeasure for eliminating such abnormality, the Applicant adopts that prior to polishing, the surface of the running metal plate for printing plate is preliminarily polished by a non-woven cloth roller containing polishing agent.

However, where the metal plate for printing plate is preliminarily polished by a conventional non-woven cloth roller, although a graining failure can be prevented while in polishing, there is a disadvantage that an appearance failure (polishing streak) which seems to be caused by the polishing agent occurs on the surface of the metal plate for printing plate while in preliminary polishing.

Further, in a conventional preliminary polishing method, there is a disadvantage that non-uniformity of preliminary polishing occurs on the surface of the metal plate for printing plate to be preliminarily polished, impurities such as Cu or Fe segregated at the top layer portion of the metal plate for printing plate remain, and a graining failure occurs in the subsequent polishing.

SUMMARY OF THE INVENTION

The present invention has been achieved in view of the foregoing circumstance. It is an object of the present invention to provide a planographic printing plate capable of ensuring improvement of productivity and stability of small dot net portions due to improvement of adhesion.

To achieve the foregoing object, the present invention provides a planographic printing plate wherein a surface of an aluminum plate, a support element, of a planographic printing plate has been subjected to preliminary polishing mechanically by at least 0.1 $\mu$m; chemical etching treatment by at least 0.1 $\mu$m ; electrochemical surface-roughening; and anodic oxidation, and a surface structure of the aluminum plate is characterized in that: (a) an area (S) for a graphic formed by a reference straight line drawn from a top of a third highest mountain of a two-dimensional roughness curve downwardly by 1 $\mu$m and a roughness curve above the reference straight line is 30 $\mu m^2 \leqq S \leqq 150$ $\mu m^2$; (b) an average roughness Ra of average lines is 0.15 $\mu m \leqq Ra \leqq 0.60$ $\mu$m; (c) a relationship between the average roughness Ra of average lines and a height Rp of a center line is $Rp \leqq 6Ra$; (d) a relationship between a maximum height Rmax and the average roughness Ra of average lines is $Rmax \leqq 12Ra$; and (e) a surface area difference is between 20% and 70%.

It is another object of the present invention to provide a method and apparatus for preliminarily polishing a non-woven cloth roller and a metal plate for printing plate free of polishing streaks on the surface of the metal plate for printing plate in preliminary polishing, the metal plate being capable of preventing a graining failure while in polishing.

To achieve the foregoing object, the present invention provides the non-woven cloth roller having a polishing agent contained in a roll-shaped non-woven cloth, characterized in that an average particle size of the polishing agent contained in the non-woven cloth is at most 50 μm, a maximum particle size is at most 60 μm, and density of the polishing agent on a fiber surface of the non-woven cloth is at least 60%.

To achieve the foregoing object, the present invention provides a method for preliminarily polishing a metal plate for printing plate, wherein a surface of the running web-shaped metal plate for printing plate is preliminarily polished by a non-woven cloth roller containing the polishing agent as preprocessing for polishing and surface-roughening of the metal plate for printing plate, the method characterized in that: an average particle size of the polishing agent contained in the non-woven cloth prior to starting use of the non-woven cloth roller is at least 50 μm, the maximum particle size is at most 60 μm, and the density of the polishing agent on the fiber surface of the non-woven cloth is at least 60%.

To achieve the foregoing object, the present invention provides an apparatus for preliminarily polishing a metal plate for printing plate, wherein the surface of a running web-shaped metal plate for printing plate is preliminarily polished as preprocessing for polishing and surface-roughening of the metal plate for printing plate, the apparatus characterized by comprising: a non-woven cloth roller disposed at one side having the metal plate for printing plate sandwiched, wherein the average particle size of the polishing agent contained in a roll-shaped non-woven cloth is at most 50 μm, the maximum particle size is at most 60 μm, and the density of the polishing agent on the fiber surface of the non-woven cloth is at least 60%; support rollers disposed in one pair on the other side having the metal plate for printing plate sandwiched with predetermined intervals, the support rollers supporting the metal plate for printing plate; a forwarding and retracting device for pressing the non-woven cloth roller to the support roller side and pushing the metal plate for printing plate between the pair of support rollers; and a water supply device for supplying water to a surface of the metal plate for printing plate.

According to the present invention, there is used a non-woven cloth roller, wherein the average particle size of polishing agent contained in a roll-shaped non-woven cloth is at most 50 μm, the maximum particle size is at most 60 μm, and the density of the polishing agent on the fiber surface of the non-woven cloth is at least 60% so as to preliminarily polish the metal plate for printing plate. Thus, in preliminary polishing, no polishing streak occurs on the surface of the metal plate for printing plate, and a graining failure can be prevented while in polishing.

Further, to achieve the foregoing object, the present invention provides a method for preliminarily polishing a metal plate for printing plate, wherein a surface of the running web-shaped metal plate for printing plate is preliminarily polished by a non-woven cloth roller containing a polishing agent as preprocessing for polishing and surface-roughening the metal plate for printing plate, the method characterized in that when a peripheral rotation speed of the non-woven cloth roller is defined as $V_1$ (m/minute), a running speed of the metal plate for printing plate is defined as $V_2$ (m/minute), the average particle size when the polishing agent contained in the non-woven cloth roller is represented by a diameter corresponding to a circle is D (μm), and the preliminary polishing quantity of the metal plate for printing plate is defined as X (μm), the $V_1$, $V_2$, D, and X is set so as to meet the following formula to make preliminary polishing: $5 \leqq D \times V_1 \times X / V_2 \leqq 20000$.

According to the present invention, the peripheral rotation speed of the non-woven cloth roller is defined as $V_1$ (m/minute); the running speed of the metal plate for printing plate is defined as $V_2$ (m/minute); the average particle size when the polishing agent contained in the non-woven cloth roller is represented by a diameter corresponding to a circle is defined as D (μm); and the preliminary polishing quantity of the metal plate for printing plate is defined as X (μm), thereby causing preliminary polishing so as to meet $5 \leqq D \times V_1 \times X / V_2 \leqq 20000$. Thus, the non-uniformity of preliminary polishing does not occur, and a graining failure can be prevented while in polishing.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENT

Figure 1:
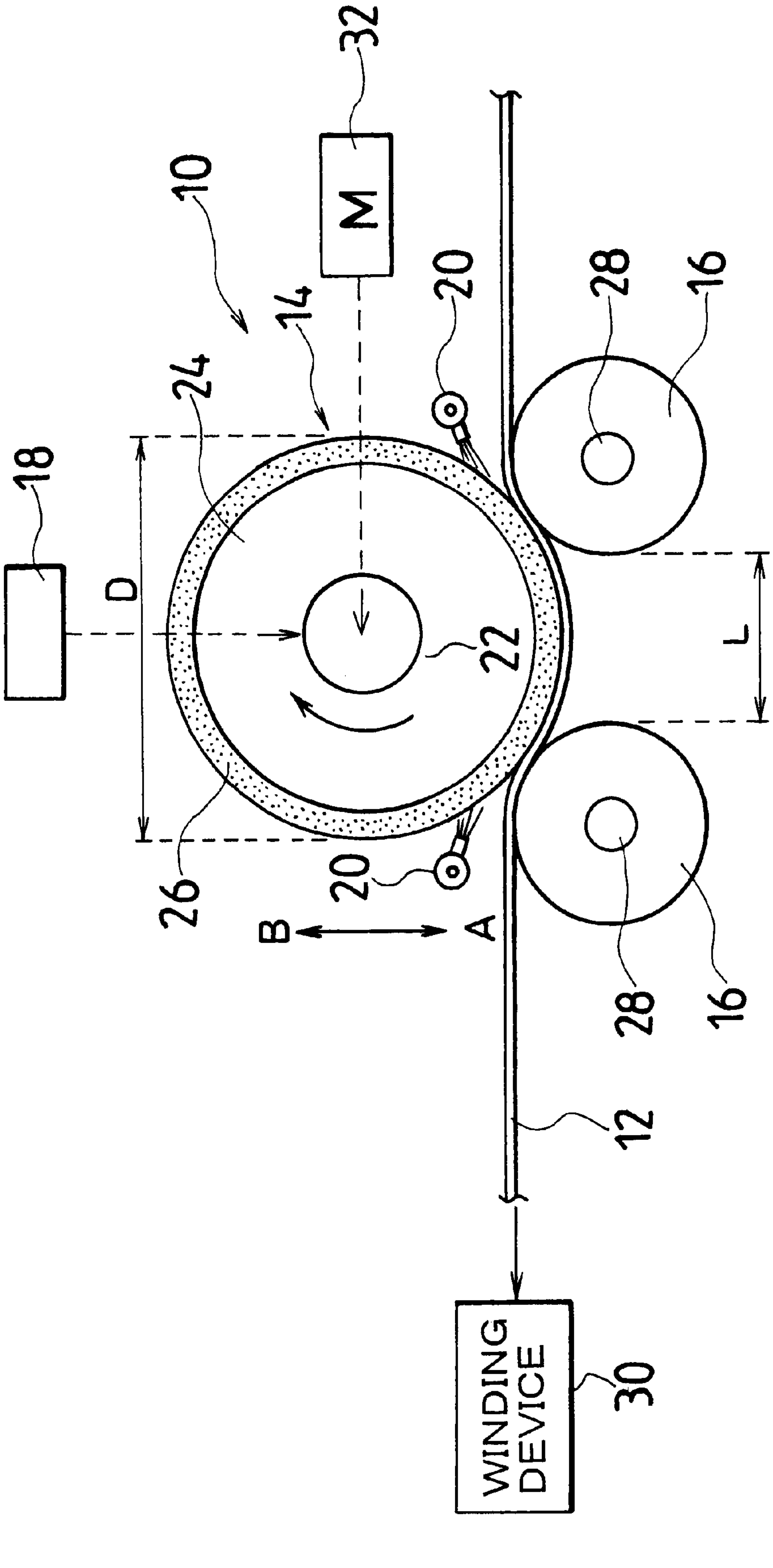
FIG. 1 is a structural view showing a preliminary polishing apparatus of the metal plate for printing plate according to the present invention.

In the present invention, pure aluminum or aluminum alloy is contained in an aluminum plate to be used. As the aluminum alloy, various products can be used and they may include, for example, silicon, copper, manganese magnesium, chrome, zinc, lead, nickel, bismuth alloys. There are various aluminum alloys. As an offset printing plate material, for example, in Japanese Patent Publication No. 58-6635, Fe and Si components are limited, and an inter-metal compound is specified. In addition, in Japanese Patent Publication No. 55-28874, cold rolling and intermediate annealing are carried out, and a method for applying a voltage to ensure electrolytic surface-roughening is limited. Not only aluminum alloys disclosed in the specifications of Japanese Patent Publication Nos. 62-41304, 1-46577, 1-46578, 1-47545, 1-35910, 63-60823, 63-60824, 4-13417, 4-19290, 4-19291, 4-19293, and 62-50540; Japanese Patent Laid-Open Nos. 61-272357, 62-74060, 61-201747, 63-143234, 63-143235, 63-255338, and 1-283350; EP 272528, U.S. Pat. Nos. 4,902,353 and 4,818,300; EP 394816, U.S. Pat. No. 5,010,188, West Germany Patent No. 3232810, U.S. Pat. No. 435,230, EP 239995, U.S. Pat. No. 4,822,715, West Germany Patent No. 3507402, U.S. Pat. No. 4,715,903, West Germany Patent No. 3507402, EP 289844, U.S. Pat. Nos. 5,009,722 and 4,945,004, West Germany Patent No. 3714059, U.S. Pat. No. 4,686,083 and 4,861,396, and EP 158941, but also general alloys are all included. A method for manufacturing a plate material using hot rolling and a method to be carried out with continuous casting are recently filed. For example, in the specification of East Germany Patent No. 252799, a plate material made by a double-roll system is introduced. In the specifications of EP 223737 and U.S. Pat. Nos. 4,802,935 and 4,800,950, plate materials in the form in which trace alloy components are limited are filed. In the specification of EP 415238, continuous casting and continuous casting and hot rolling are proposed.

In the present invention, various surface treatment, transfer or the like is carried out for such aluminum plate, whereby a print original plate having its uniform irregularities can be obtained, on which a photosensitive layer made of diazo compound or the like is provided, whereby a superior photosensitive planographic printing plate can be obtained. In any case, it is required to select a proper material.

In addition, occasionally, degreasing may be first carried out. In the case where degreasing process is carried out, a method in which a solvent such as trichloroethylene or a surface active agent is employed or an alkaline etching agent such as sodium hydroxide or potassium hydroxide is employed is widely employed. In Japanese Patent Laid-Open No. 2-026793, a description of degreasing process is given. For example, a solvent degreasing method employs petroleum-based solvents such as gasoline, kerosine, benzine, solvent naphtha, and normal hexane; and employs chlorine-based solvents such as trichloroethylene, methylene chloride, parchloroethylene, and 1,1,1-trichloroethane. An alkali degreasing method employs an aqueous solution of soda salts such as sodium hydroxide, sodium carbonate, sodium bicarbonate, and sodium sulfate; employs an aqueous solution of silicates such as sodium orthosilicate, sodium metasilicate, secondary sodium silicate, and tertiary sodium silicate; or employs phosphate an aqueous solution of phosphates such as monobasic sodium phosphate, tribasic sodium phosphate, dibasic sodium phosphate, sodium tripolyphosphate, sodium pyrophosphate, and sodium hexametaphosphate. When an alkali degreasing method is employed, there is a possibility that an aluminum surface is melted depending on a treatment time and a treatment temperature. As to the degreasing process, it is required that a melting phenomenon does not occur. The degreasing process with a surface active agent employs an aqueous solution of an anionic surface active agent, a cationic surface active agent, a non-ionic surface active agent, and an amphoteric surface active agent, and a variety of commercially available products or the like can be employed. The degreasing method includes immersion, blowing, and containing liquid in cloth or the like and rubbing or the like. In addition, ultrasonic waves may be employed for immersion or blowing.

Preliminary polishing will be described here. In the case where preliminary polishing is carried out mechanically, it is preferable that preliminary polishing is carried out by a roller produced by containing a polishing agent of 1 to 25 $\mu$m in average particle size in a non-woven cloth composed of polyamide, polyester, rayon or the like. It is required to select a preliminary polishing condition capable of maintaining surface-roughness to a certain extent. It is preferable that the roller diameter is 200 to 1000 mm, and vibration of 5 to 2000 times per minute is applied in a direction perpendicular to a rolling direction of the original plate or in a direction perpendicular to line direction in the case of continuous processing in order to maintain a uniform face quantity. In any case, it is important that the center line surface-roughness is set to 0.15 to 0.35 $\mu$m and the maximum surface-roughness is set to 1 to 3.5 $\mu$m by preliminary polishing. In addition, in preliminary polishing, it is required to polish the aluminum surface by at least 0.1 $\mu$m in order to remove a component that inhibits electrochemical surface-roughening.

When mechanical surface-roughening is carried out, there is a variety of methods employing brush, liquid honing or the like, which is required to select in consideration of productivity or the like.

A variety of transfer methods for bringing a ragged face into pressure contact with an aluminum plate can be used. That is, in addition to the methods disclosed in the aforementioned Japanese Patent Laid-Open Nos. 55-74898, 60-36195, and 60-203496, a method disclosed in Japanese Patent Laid-Open No. 6-55871, the method characterized in that transfer is carried out several times and a method disclosed in Japanese Patent Laid-Open No. 6-24168, the method characterized in that a surface is elastic are applicable.

In addition, using electric discharge processing, shot blasting, laser, or plasma etching, transfer is repeatedly carried out by employing a roller having fine irregularities engraved thereon or a face having its irregularities to which fine particulate is applied is brought into contact face with an aluminum plate on which a pressure is repeatedly applied in a plurality of lines, whereby an irregularity pattern corresponding to an average diameter of fine particulate may repeatedly be transcribed to the aluminum plate.

Methods for applying fine irregularities to the transfer roller are publicly known in Japanese Patent Laid-Open Nos. 3-08635, 3-066404, and 63-065017. In addition, a fine groove is cut on the roller surface in two directions using a die, cutting tool, or laser and the like, whereby rectangular irregularities may be provided on the surface. This roller surface is subject to publicly known etching process or the like, whereby processing may be carried out such that the formed irregularities are rounded. Of course, burning, hard chrome plating or the like may be carried out in order to increase the surface hardness.

Further, surface-roughening with brush includes surface-roughening with wire brush as well as surface-roughening with nylon brush or the like. Surface-roughening with high-pressure water is disclosed in Japanese Patent Laid-Open Nos. 59-21469, 60-19595, and 60-18390 or the like.

Thus, after the aluminum surface has been prepared with mechanical surface-roughening, the aluminum surface is chemically treated by acid or alkali for the purpose of smoothening an aluminum plate or making the plate uniform as required. Specific examples of acids or alkalis used for such chemical treatment include a method employing aqueous solution of soda salt such as phosphate, sulfate, chloride, nitrate, sodium hydroxide, sodium carbonate, sodium bicarbonate, or sodium sulfate; a method employing aqueous solution of silicate salt such as sodium orthosilicate, sodium metasilicate, secondary sodium silicate, or tertiary sodium silicate; a method employing aqueous solution of phosphate such as monobasic sodium phosphate, tribasic sodium phosphate, dibasic sodium phosphate, sodium tripolyphosphate, sodium pyrophosphate, or sodium hexametaphosphate. The treatment conditions are properly selected from concentration of 0.01 wt. % to 50 wt. %, temperature of 20° C. to 90° C., and time intervals of 5 seconds to 5 minutes. Preprocessing for electrochemical surface-roughening is proposed in Japanese Patent Laid-Open Nos. 54-65607 and 55-125299. Although a variety of preprocessing functions are included in Japanese Patent Laid-Open Nos. 63-235500, 63-307990, 1-127388, 1-160690, 1-136789, 1-136788, 1-178497, 1-308689, 3-126871, 3-126900, and 3-173800, the present invention is not limited thereto. However, when the aluminum surface is chemically treated by aqueous solution of acid or alkali in this way, an insoluble residue, i.e., smut is produced on its surface. This smut can be removed by phosphoric acid, nitric acid, sulfuric acid, chromic acid or these mixture. In the present invention, the aluminum surface to be electrochemically surface-roughened is desirably a clean face free of smut. However, in the case where an electrolyte is acidic, and has a de-smut action, removal of smut can be removed. Thus, in the case of chemical etching, it is required to etch an aluminum surface of at least 0.1 $\mu$m in order to carry out subsequent electrochemical surface-roughening uniformly.

The thus treated aluminum plate is subject to electrochemical surface-roughening, and smut is removed in a component identical to an electrolyte during electrolytic surface-roughening. Electrochemical surface-roughening is disclosed in the specifications of Japanese Patent Publication No. 48-28123 and British Patent No. 896563. In the above electrolytic graining, although a sine wave alternating current is employed, a specific wave as disclosed in Japanese Patent Laid-Open No. 52-58602 may be employed. In addition, there can be applied methods disclosed in Japanese Patent Laid-Open Nos. 55-158298, 56-28898, 52-58602, 52-152302, 54-85802, 60-190392, 58-120531, 63-176187, 1-5889, 1-280590, 1-118489, 1-148592, 1-178496, 1-188315, 1-154797, 2-235794, 3-260100, 3-253600, 4-72079, 4-72098, 3-267400, and 1-141094.

In addition to the aforementioned ones, frequencies proposed in an electrolyte capacitor can be used, for example, in the specifications of U.S. Pat. No. 4276129 and 4676879 or the like.

In addition to the aforementioned electrolytes such as nitric acid or hydrochlonic acid, there can be used electrolytes disclosed in U.S. Pat. Nos. 4,671,859, 466,576, 4,661, 219, 4,618,405, 462,628, 4,600,482, 4,566,960, 4,566,958, 4,566,959, 4,416,972, 4,374,710, 4,336,113, 4,184,932 or the like. Various electrolytic cells and power sources are proposed in the specifications of U.S. Pat. No. 4,203,637 and Japanese Patent Laid-Open Nos. 56-123400, 57-59770, 53-12738, 53-32821, 53-32822, 53-32823, 55-122896, 55-132884, 62-127500, 1-52100, 1-52098, 60-67700, 1-230800, 3-257199 or the like. In addition to the above mentioned patents, various electrolyte jars and power sources are proposed. For example, of course, there can be applied those disclosed in Japanese Patent Laid-Open Nos. 52-58602, 52-152302, 53-12738, 53-12739, 53-32821, 53-32822, 53-32833, 53-32824, 53-32825, 54-85802, 55-122896, and 55-132884; Japanese Patent Publication Nos. 48-28123 and 51-7081; and Japanese Patent Laid-Open Nos. 52-133838, 52-133840, 52-133844, 52-133845, 53-149135, and 54-146234.

Smut removal is carried out by using a liquid having components identical to those of an electrolyte as described previously. If smut removal is carried out by using a liquid having components different from those of an electrolyte, water washing process is required after the smut removing process, which contributes to an increase in cost, and affects electrolytic grain properties. With the same component, even if such smut removal is carried out in a system in which a temperature or concentration is changed, it is possible to manage or control the temperature and concentration in the electrolytic surface-roughening process. Although the smut removing method includes chemically dissolving the smut, the liquid is allowed to collide with a web at a high speed with spraying or the like, whereby the smut may be forcibly removed. In any case, the method may be selected comprehensively considering productivity, facility cost, cell shape for electrolytic surface-roughening. In any system, it is essential to remove the smut by 5% to 70% in quantity. The smut generated due to electrolytic surface-roughening changes by about 0.2 $g/m^2$ to 5 $g/m^2$ in quantity under electrolytic conditions, and thus, the quantity of smut may be changed in this range in order to remove the smut in the target quality and performance.

The thus obtained aluminum plate is subject to alkali or acid treatment as required. The aluminum plate is alkali treated as in Japanese Patent Laid-Open No. 56-51388, and is de-smutted by sulfate as in Japanese Patent Laid-Open No. 53-12739. In addition, the aluminum plate is phosphate treated as in Japanese Patent Laid-Open No. 53-115302, and there can be employed the methods disclosed in Japanese Patent Laid-Open Nos. 60-8091, 63-176188, 1-38291, 1-127389, 1-188699, 3-177600, 3-126891, 3-191100 or the like.

On the surface of the thus obtained aluminum support element, it is preferable to form an anodic oxidation skin film. When a current is applied using aluminum as an anode in an aqueous solution or non-aqueous solution of sulfuric acid, phosphoric acid, chromic acid, oxalic acid, sulfamic acid, benzene sulfonic acid and the like or a combination of at least two of these as an electrolyte, the anodic oxidation skin film can be formed on the aluminum surface. The treatment conditions for anodic oxidation change variously depending on an electrolyte to be used, and thus, it is difficult to approximately define the conditions. In general, it is proper that the concentration of an electrolyte is 1–80 wt. %, the liquid temperature is 5–70° C., the current density is 0.5–60 $A/cm^2$, the voltage is 1–100 V, and the electrolyzing time is 15 seconds to 50 minutes. The electrolyzing devices are introduced in Japanese Patent Laid-Open Nos. 48-26638 and 47-18739; and Japanese Patent Publication No. 58-24517. In addition, there can be used, of course, methods disclosed in Japanese Patent Laid-Open Nos. 54-81133, 57-47894, 57-51289, 57-51290, 57-54300, 57-136596, 58-107498, 60-200256, 62-136596, 63-176494, 4-176897, 4-280997, 6-207299, 5-32083, 5-125597, and 5-195291. There can be used, of course, treatment liquids disclosed in Japanese Patent Laid-Open Nos. 3-253596, 62-82089, 1-133794, 54-32424, 5-42783 or the like.

As described above, after the anodic oxidation skin film is formed, an anodic oxidation skin film is etched in order to optimize adhesion between each support element and a photosensitive composition. Then, pore sealing treatment is carried out by steam and hot water. As a result, there is provided a pore sealing treatment apparatus for a support element imparting a photosensitive printing plate having its good stability with an elapse of time and good developing properties, and free of dirt at the non-image portion (Japanese Patent Publication No. 56-12518). Post-processing for generating a skin film may be carried out in such apparatus. In addition, pore sealing treatment may be carried out with the apparatuses and methods disclosed in Japanese Patent Laid-Open Nos. 4-4194, 5-202496, and 5-179482.

Further, there can be applied potassium zirconium acid fluoride treatment disclosed in the specification of U.S. Pat. No. 2,946,638; phosphomolybdate treatment disclosed in the specification of U.S. Pat. No. 3,201,247; alkyl titanate treatment disclosed in the specification of British Patent No. 1108559; polyacrylic acid treatment disclosed in the specification of German Patent No. 1091433; polyvinyl phosphonic acid treatment disclosed in the specification of German Patent No. 1134093 or British Patent No. 1230447; phosphonic acid treatment disclosed in Japanese Patent Publication No. 44-6409; phytic acid treatment disclosed in the specification of U.S. Pat. No. 3,307,951; treatment which a divalent metal salt of a lipophilic organic polymeric compound disclosed in Japanese Patent Laid-Open No. 58-16893 or 58-18291; providing an undercoat layer of hydrophilic cellulose (for example, carboxymethyl cellulose) containing a water-soluble metal salt (for example, zinc acetate) as disclosed in the specification of U.S. Pat. No. 3,860,426; undercoating a water-soluble polymer having a sulfonic acid radical, thereby making it hydrophilic disclosed in Japanese Patent Laid-Open No. 59-101651; undercoating of phosphate disclosed in Japanese Patent Laid-Open No. 62-019494; of a water-soluble epoxy compound disclosed in Japanese Patent Laid-Open No. 62-033692; of phosphate-modified starch disclosed in Japanese Patent Laid-Open No. 62-097892; of diamine compound disclosed in Japanese Patent Laid-Open No.

63-056498; of inorganic or organic animo acid disclosed in Japanese Patent Laid-Open No. 63-130391; of organic phosphonic acid containing a carboxyl group or hydroxyl group disclosed in Japanese Patent Laid-Open No. 63-145092; of a compound having an amino group and a phosphonic acid radical disclosed in Japanese Patent Laid-Open No. 63-165183; of a specific carboxylic acid derivative disclosed in Japanese Patent Laid-Open No. 2-316290; of a phosphate ester disclosed in Japanese Patent Laid-Open No. 1-272594; of compound having one amino group and one phosphorous oxygen acid radical disclosed in Japanese Patent Laid-Open No. 3-261592; of phosphate ester disclosed in Japanese Patent Laid-Open No. 3-215095; of aliphatic or aromatic phosphonic acid such as phenylphosphonic acid disclosed in Japanese Patent Laid-Open No. 5-246171; compound containing S atoms such as thiosalicylic acid disclosed in Japanese Patent Laid-Open No. 1-307745 and of a compound having a phosphorous oxygen acid radical disclosed in Japanese Patent Laid-Open No. 4-282637; and coloring with acidic dye disclosed in Japanese Patent Laid-Open No. 60-64352.

After such support element has been prepared, a difference (S) in graphic area; Ra; Rmax; and a difference in surface area are measured. The difference in surface area for a graphic is obtained by measuring a two-dimensional surface-roughness curve of the support element surface under the following conditions:

Contact needle diameter: 0.1 μm cone-shaped

Feed speed: 0.4 mm/s

Sampling: 12.5 m/sec

Measurement length: 0.4 mm

Apparatus required: ET350 available from Kosaka Kenkyujyo

An area for a graphic formed between a reference straight line drawn downwardly by 1 μm from the top of the third highest mountain of the thus obtained two-dimensional surface-roughness curve and the roughness curve above the reference straight line is defined as S, and is obtained.

Ra denotes an average roughness of average lines, disclosed in JIS B0601-1982. Rp denotes a height of the center line mountain, wherein a portion of the measurement length L is extracted from the coarse curve in its center line direction; and denotes a difference in intervals from a straight line parallel to the center line of this extracted portion and passing the highest top of the mountain. Rmax is the highest top disclosed in JIS B0601-1982.

In the difference in surface area, the surface shape is measured within the measurement range of 50 $\mu m^2$ by employing AFM (atomic force microscope) whose resolution in horizontal (X, Y) direction is 0.1 μm. For the difference in surface area, when a surface area obtained by approximation three-dot method is defined as $a_1$, and the upper projection area is defined as $a_0$, a value to be obtained by $(a_1-a_0)/a_0\times100$ is represented in units of %.

The support element according to the present invention is provided with a photosensitive layer embodied below to make a photosensitive planographic printing plate.

[I] When a photosensitive layer containing o-naphthoquinonediazide sulfonic acid ester and phenol cresol mixed novolac resin is provided o-quinonediazide compounds are o-naphthoquinonediazide compounds, and are disclosed in a number of publications including the specifications of U.S. Pat. Nos. 2,766,118, 2,767,092, 2,772,972, 2,859,112, 3,102,809, 3,106,465, 3,635,709, and 3,647,443. These compounds can be preferably used. Particularly preferred among them are o-naphthoquinonediazide sulfonic acid esters or o-naphthoquinonediazide carboxylic acid esters of aromatic hydroxy compounds; and o-naphthoquinonediazide sulfonic acid amides or o-naphthoquinonediazide carboxylic acid amides of aromatic animo compounds. In particular, very excellent are ester reaction product of o-naphthoquinonediazide sulfonic acid with a condensation product of pyrogallol and acetone disclosed in the specification of U.S. Pat. No. 3,635,709; ester reaction product of o-naphthoquinonediazide sulfonic acid or o-naphthoquinonediazide carboxylic acid with a polyester having a hydroxy group at its end disclosed in the specification of U.S. Pat. No. 4,028,111; ester reaction product of o-naphthoquinonediazide sulfonic acid or o-naphthoquinonediazide carboxylic acid with a p-hydroxy styrene homopolymer or copolymer with other copolymerizable monomers as disclosed in British Patent No. 1,494,043; amide reaction product of o-naphthoquinonediazide sulfonic acid or o-naphthoquinonediazide carboxylic acid with a copolymer of p-amino styrene and other copolymerizable monomers as disclosed in the specification of U.S. Pat. No. 3,759,711.

These o-quinonediazide compounds can be used singly, but it is preferable to use them mixed with an alkali-soluble resin. Preferable alkali-soluble resins include novolac type phenol resins, specifically phenol formaldehyde resins, o-cresol formaldehyde resins, m-cresol formaldehyde resins or the like. Further, it is more preferable to use the above-mentioned phenol resin together with a condensation product of phenol substituted by an alkyl group having 3 to 8 carbons or cresol and formaldehyde such as t-butyl phenol formaldehyde resin as disclosed in the specification of U.S. Pat. No. 4,028,111.

In addition, in order to form a visible image with exposure, there are added compounds such as o-naphthoquinonediazide-4-sulfonyl chloride; inorganic anion salt of p-diazodiphenyl amine; trihalomethyloxadiazol compound; trihalomethyloxadiazol compound having a benzofuran ring or the like. Image coloring agents include triphenyl methane dyes such as Victoria Blue BOH, Crystal Violet, and Oil blue. A dye disclosed in Japanese Patent Laid-Open No. 62-293247 is particularly preferred.

Further, grease sensing agents can include a phenol substituted by an alkyl group having 3 to 15 carbons as disclosed in Japanese Patent Publication No. 57-23253, for example, t-butyl phenol, N-octyl phenol, a novolac resin obtained by condensation of t-butyl phenol and formaldehyde, or o-naphthoquinonediazide-4- or -5-sulfonic acid ester of such novolac resin (disclosed in Japanese Patent Laid-Open No. 61-242446, for example).

Furthermore, in order to improve developing properties, it can contain a non-ionic surface active agent as disclosed in Japanese Patent Laid-Open No. 62-251740.

The above composition is dissolved in a solvent for solving each of the components, and is applied onto the support element. Solvents to be used here include ethylene dichloride, cyclohexanone, methyl ethyl ketone, ethylene glycol monomethyl ether, etylene glycol monoethyl ether, 2-methoxy ethyl acetate, 1-methoxy-2-propanol, 1-methoxy-2-propyl acetate, methyl lactate, ethyl lactate, dimethyl sulfoxide, dimethyl acetoamide, dimethyl formamide, water, N-methyl pyrrolidone, tetrahydrofulfuryl alcohol, acetone, diacetone alcohol, methanol, ethanol, isopropanol, diethylene glycol dimethyl ether or the like, and these solvents are used singly or in mixture.

A photosensitive composition comprising these components is provided as a solid component by 0.5 to 3.0 $g/m^2$.

[II] When a photosensitive layer containing a diazo resin and a water-insoluble and lipophilic polymeric compound is provided Diazo resins include, for example, organic-solvent-soluble diazo resin in organic salts that are reaction products of a condensation product of p-diazodiphenyl amine and formaldehyde or acetoaldehyde; and hexafluorophosphate or tetrafluoro borate; and organic-solvent-soluble diazo resin inorganic salts that are reaction products of the above condensation product and sulfonic acids, for example, p-toluenesulfonic acid or its salts; phosphinic acids, for example, benzenephosphinic acid or its salts; and hydroxyl-group-containing compounds, for example, 2, 4-dihydroxy benzophenone, 2-hydroxy-4-methoxybenzophenone-5-sulfonic acid or its salts as disclosed in the specification of U.S. Pat. No. 3,300,309.

In the present invention, other diazo resins that can be preferably employed include co-condensation products containing as a structural unit, aromatic compounds having at least one organic group of a carboxyl group, sulfonic acid radical, sulphinic acid radical, phosphorous oxygen acid radical, and hydroxyl group; and diazonium compounds, preferably aromatic diazonium compounds.

Preferably, the above aromatic rings can include a phenyl group or a naphthyl group.

There are exemplified various aromatic compounds containing at least one of the aforementioned carboxyl group, sulfonic acid radical, sulphinic acid radical, a phosphorous oxygenic acid radical, and hydroxyl group. Preferably, these include 4-methoxy benzoic acid, 3-chlorobenzoic acid, 2, 4-dimethoxy benzoic acid, p-phenoxy benzoic acid, 4-anilinobenzoic acid, phenoxy acetatic acid, phenyl acetatic acid, p-hydroxy benzoic acid, 2, 4-dihydroxy benzoic acid, benzene sulfonic acid, p-toluene sulphinic acid, 1-naphthalene sulfonic acid, phenyl phosphonic acid, phenyl phosphonic acid or the like. A diazonium salt as disclosed in Japanese Patent Publication No. 49-48001, for example, can be employed for an aromatic diazonium compound as a constituent unit of the aforementioned co-condensed diazo resin, and in particular, diphenyl amine-4-diazonium salts are preferred.

Diphenylamine-4-diazonium salts are derived from 4-amino-diphenyl amines. Such 4-amino-diphenyl amines includes 4-amino diphenyl amine, 4-amino-3-methoxy diphenyl amine, 4-amino-2-methoxy diphenyl amine, 4'-amino-2-methoxy diphenyl amine, 4'-amino-4-methoxy diphenyl amine, 4-amino-3-methyl diphenyl amine, 4-amino-3-ethoxy diphenyl amine, 4-amino-3-β-hydroxy ethoxy diphenyl amine, 4-amino-diphenyl amine-2-sulfonic acid, 4-amino-diphenyl amine-2-carboxyl acid, 4-amino-diphenyl amine-2'-carboxylic acid or the like. 3-methoxy-4-amino-4-diphenyl amine and 4-amino diphenyl amine are particularly preferred.

In addition, as diazo resins other than diazo resins co-condensed with an aromatic compound having an acid radical, aldehyde containing an acidic radical and diazo resins condensed with its acetal compound disclosed in Japanese Patent Laid-Open Nos. 4-18559, 3-163551, and 3-253857 can be preferably used.

Paired anions of diazo resins include anions that constantly form salts with diazo resins, and that make the resins soluble in organic solvent. These include organic carboxylic acids such as decanoic acid and benzoic acid; organic phosphonic acids such as phenyl phosphoric acids; and sulfonic acids. Typical examples include aliphatic and aromatic sulfonic acids such as methanesulfonic acid, fluoroalkane sulfonic acid such as trifluoro methanesulfonic acid, lauryl sulfonic acid, dioctyl sulfonesuccinic acid, dicyclohexyl sulfonesuccinic acid, campher-sulfonic acid, tolyloxy-3-propane sulfonic acid, nonyl phenoxy-3-propane sulfonic acid, nonyl phenoxy-4-butane sulfonic acid, dibutyl phenoxy-3-propane sulfonic acid, diamyl phenoxy-3-propane sulfonic acid, dinonyl phenoxy-3-propane sulfonic acid, dibuthyl phenoxy-4-butane sulfonic acid, dinonyl phenoxy-4-butane sulfonic acid, benzene sulfonic acid, toluene sulfonic acid, mesitylene sulfonic acid, p-chlorobenzene sulfonic acid, 2, 5-dichlorobenzene sulfonic acid, sulfosalicylic acid, 2, 5-dimethyl benzene sulfonic acid, p-acetyl benzene sulfonic acid, 5-nitro-o-toluene sulfonic acid, 2-nitrobenzene sulfonic acid, 3-chlorobenzene sulfonic acid, 3-bromobenzene sulfonic acid, 2-chloro-5-nitrobenzene sulfonic acid, butyl benzene sulfonic acid, octyl benzene sulfonic acid, decyl benzene sulfonic acid, dodecyl benzene sulfonic acid, butoxy benzene sulfonic acid, dodecyloxybenzene sulfonic acid, 2-hydroxy-4-methoxy benzophenone-5-sulfonic acid, isopropyl naphthalene sulfonic acid, butyl naphthalene sulfonic acid, hexyl naphthalene sulfonic acid, octyl naphthalene sulfonic acid, buthoxy naphthalene sulfonic acid, dodecyloxynaphthalene sulfonic acid, dibutyl naphthalene sulfonic acid, dioctyl naphthalene sulfonic acid, triisopropyl naphthalene sulfonic acid, tributyl naphthalene sulfonic acid, 1-naphthol-5-sulfonic acid, naphthalene-l-sulfonic acid, naphthalene-2-sulfonic acid, 1, 8-dinitro-naphthalene-3, 6-disulfonic acid, and dimethyl-5-sulfoisonaphthalate; hydroxyl group-containing aromatic compounds such as 2, 2', 4, 4'-tetrahydroxy benzophenone, 1,2,3-trihydroxy benzophenone, 2,2',4-trihydroxy benzophenone; halide Lewis acids such as hexafluorophosphoric acid and tetrafluoroboric acid, and perhalogenic acids such as $HClO_4$ and $HIO_4$ without being limited thereto. Among them, butyl naphthalene sulfonic acid, dibutyl naphthalene sulfonic acid, hexafluorophosphonic acid, 2-hydroxy-4-methoxybenzophenone-5-sulfonic acid, and dodecyl benzene sulfonic acid are particularly preferred.

For the diazo resins used in the present invention, molecular weight can be obtained as an arbitrary value by variously changing the molar ratio of each monomer and condensation conditions. In order to effectively use the diazo resins for target applications of the present invention, it is preferable that the molecular weight is about 400 to 100,000, preferably, about 800 to 8,000.

Water-insoluble and lipophilic polymeric compounds include copolymers with molecular weights generally of 10,000 to 200,000, in which monomers shown in the following (1) to (17) are their structural units.

(1) Acrylamides, methacrylamides, acrylate esters, methacrylic acid esters, and hydroxy styrenes having aromatic hydroxyl group, for example, N-(4-hydroxyphenyl) acrylamide or N-(4-hydroxyphenyl) methacrylamide, o-, m-, p-hydroxy styrene, o-, m-, p-hydroxy phenyl-acrylate or methacrylate;

(2) Acrylic acid esters and methacrylic acid esters having an aliphatic hydroxy group, for example, 2-hydroxy ethyl acrylate or 2-hydroxy ethyl methacrylate, or 4-hydroxy butyl methacrylate;

(3) Unsaturated carboxylic acid such as acrylic acid, methacrylic acid, maleic anhydride, or itaconic acid;

(4) (Substituted) alkyl acrylate such as methyl acrylate, ethyl acrylate, propyl acrylate, butyl acrylate, amyl acrylate, hexyl acrylate, cyclohexyl acrylate, octyl acrylate, benzyl acrylate, 2-chloroethyl acrylate, acrylate glycidyl, N-dimethyl amino ethyl acrylate;

(5) (Substituted) alkyl methacrylate such as methyl methacrylate, ethyl methacrylate, propyl methacrylate, butyl methacrylate, amyl methacrylate, cyclohexylmethacrylate, benzyl methacrylate, glycidyl methacrylate, or N-dimethyl amino ethyl methacrylate;

(6) Acrylamides or methacrylamides such as acrylamide, methacrylamide, N-methylol acryl amide, N-methylol methacrylamide, N-ethyl acrylamide, N-hexyl methacrylamide, N-cyclohexyl acrylamide, N-hydroxy ethyl acrylamide, N-phenyl acrylamide, N-nitrophenyl acrylamide, or N-ethyl-N-phenyl acrylamide;

(7) Vinyl ethers such as ethyl vinyl ether, 2-chloroethyl vinyl ether, hydroxy ethyl vinyl ether, propyl vinyl ether, butyl vinyl ether, octyl vinyl ether, or phenyl vinyl ether;

(8) Vinyl esters such as vinyl acetate, vinyl chloroacetate, vinyl butylate, or vinyl benzoate;

(9) Styrenes such as styrene, α-methyl styrene, or chloromethylstyrene;

(10) Vinyl ketones such as methyl vinyl ketone, ethyl vinyl ketone, propyl vinyl ketone, or phenyl vinyl ketone;

(11) Olefins such as ethylene, propylene, isobutylene, butadien, isoprene;

(12) N-vinylpyrolidone, N-vinylcarbazole, 4-vinylpyridine, acrylonitryl, methacrylonitryl or the like;

(13) Unsaturated imides such as maleimide, N-acryloyl acrylamide, N-aceketyl methacrylamide, N-propionyl methacrylamide, N-(p-chlorobenzoyl) methacrylamide;

(14) Methacrylic acid amides such as N-(o-aminosulfonylphenyl) methacrylamide, N-(m-aminosulfonylphenyl) methacrylamide, N-(p-amino) sulfonyl phenyl methacrylamide, N-(1-(3-amino sulfonyl) naphtyl) methacrylamide, or N-(2-amino sulfonyl ethyl) methacrylamide and acrylamides having a substituent similar to the above; or methacrylic acid esters such as o-amino sulfonyl phenyl bumethacrylate, m-amino sulfonyl phenyl methacrylate, p-amino sulfonyl phenyl methacrylate, 1-(3-amino sulfonyl naphtyl) methacrylate and unsaturated sulfonic amides such as acrylate esters having a substituent similar to the above;

(15) Unsaturated monomer having cross linking group on its side chain such as N-(2-(methacryloyloxy)-ethyl)-2, 3-dimethyl maleimide, and vinyl cinnamate. Further, monomers that can be co-polymerized with any of the above monomers may be co-polymerized.

(16) Phenol resin disclosed in the specification of U.S. Pat. No. 3,751,257 and polyvinyl acetal resin such as polyvinyl formal resin or polyvinyl butyral resin; or

(17) Polymeric compounds which make polyurethane alkali-soluble, disclosed in Japanese Patent Publication No. 54-19773; and Japanese Patent Laid-Open Nos. 57-904747, 60-182437, 62-58242, 62-123452, 62-123453, 63-113450, and 2-146042.

To the above copolymers, a polyvinyl butyral resin, a polyurethane resin, a polyamide resin, an epoxy resin, a novolac resin, a natural resin or the like may be added as required.

For photosensitive compositions employed for the support element according to the present invention, pigments can be employed for the purpose of obtaining visible images due to exposure and visible images after development.

The pigments include triphenyl methane-based, diphenyl methane-based, oxazine-based, xanthene-based, iminonaphthoquinone-based, azomethine-based, or anthraquinone-based pigments represented by Victoria Pure Blue BOH (available from Hodogaya Chemicals Co., Ltd.), Oil Blue #603 (available from Orient Chemical Engineering Co., Ltd.), Patent Pure Blue (available from Sumitomo Mikuni Chemicals Co., Ltd.), Crystal Violet; Brilliant Green, Ethyl Violet; Methyl Violet, Methyl Green, Erythrocin B, Basic Fuchsine; Malachite Green, Oil Red, m-Cresol Purple, Rhodamine B, Auramine, 4-p-diethyl amino phenyl iminaphthoquinone, cyano-p-diethyl amino phenyl acetoanilide or the like as examples of discoloring agents changing from chromic to achromic or differently chromic tones.

On the other hand, discoloring agents changing from achromic tones to chromic tones include leuco pigments and primary or secondary aryl amine-based pigments represented by triphenyl amine, diphenyl amine, o-chloroaniline, 1, 2, 3-triphenyl guanidine, naphtyl amine, diamino diphenyl methane, p, p'-bis-dimethyl amino diphenyl amine, 1, 2-dianilinoethylene, p, p', p"-tris-dimethyl amino triphenyl methane, p, p'-bis-dimethyl animo diphenyl methyl imine, p, p', p"-triamino-o-methyl triphenyl methane, p, p"-bis-dimethyl amino diphenyl-4-anilino naphtyl methane, and p, p', p"-triamino triphenyl methane. Particularly preferably, tripheyl methane-based and diphenyl methane-based pigments are effectively employed. Further preferably, triphenyl methane-based pigments are employed. Particularly, Victoria Pure Blue BOH is employed.

A variety of additives can be further added to photosensitive compositions employed for the support element according to the present invention.

For example, there are preferably employed alkyl ethers for improving coating properties (for example, ethyl cellulose or methyl cellulose); fluorine-based surface active agents; nonionic surface active agents (in particular, fluorine-based surface active agents are preferred.); plasticizer for imparting flexibility and friction resistance of a coat film (for example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomer and polymer of acrylic acid or methacrylic acid. Among them, tricresyl phosphate is particularly preferred.); grease sensing agent for improving grease sensitivity of an image portion (for example, semi-esterification product of styrene-maleic anhydride copolymer with alcohol, novolac resin such as p-t-butyl phenol-formaldehyde resin, 50% aliphatic acid ester of p-hydroxy styrene or the like disclosed in Japanese Patent Laid-Open No. 55-527); stabilizer (for example, phosphate, phosphorous acid, organic acid (citric acid, oxalic acid, dipicolinic acid, benzene sulfonic acid, naphthalene sulfonic acid, sulfosalicylic acid, 4-methoxy-2-hydroxy benzophenone-5-sulfonic acid, tartaric acid or the like)), accelerators (for example, higher alcohol, acidic anhydride or the like).

To provide the above mentioned photosensitive components on the support element, a photosensitive diazo resin, a lipophilic polymeric compounds, and a predetermined amount of various additives as required are dissolved in appropriate solvents (methyl cellosolve, ethyl cellosolve, dimethoxy ethane, diethylene glycol monomethyl ether, diethylene glycol dimethyl ether, 1-methoxy-2-propanol, methyl cellosolve acetate, acetone, methyl ethyl ketone, methanol, dimethyl formamide, dimethyl acetoamide, cyclo hexane, dioxane, tetrahydrofuran, methyl lactate, ethyl lactate, ethylene dichloride, dimethyl sulfoxide, water or a mixture thereof and the like), a coat liquid of photosensitive compositions is adjusted, and then, the adjusted liquid may be applied onto the support element to be dried.

Although solvents to be employed may be single, a mixture of high boiling point solvents such as methyl cellosolve, 1-methoxy-2-propanol, or methyl lactate and low boiling point solvents such as methanol and methyl ethyl ketone is further preferred.

The concentration of the solid component of the photosensitive composition to be applied is desirably within the range of 1 to 50 wt. %. In this case, the applying quantity of the photosensitive composition may generally be about 0.2 to 10 $g/m^2$ (dry weight), and further preferably, may be 0.5 to 3 $g/m^2$.

[III] When a photosensitive layer including photo-dimerization type photosensitive composition and photo-polymerization photosensitive compositions are provided The photo-dimerization type photosensitive compositions include polymers having maleimide group, cinnamyl group, cinnamoyl group, cinnamilidene group, cinnamilidene acetyl group, or chalcone group and the like on their side chain or main chain. Polymers having maleimide group on their side chain include polymers disclosed in the specifications of Japanese Patent Laid-Open No. 52-988 (corresponding U.S. Pat. No. 4,079,041); German Patent No. 2, 626, 769; European Patent No. 21,019, and European Patent No. 3,552; polymers disclosed in Die Angewandte Makromolekulare Chemie) 115 (1983) pp. 163 to 181; and polymers disclosed in Japanese Patent Laid-Open Nos. 49-128991, 49-128992, 49-128993, 50-5376, 50-5377, 50-5379, 50-5378, 50-5380, 53-5298, 53-5299, 53-5300, 50-50107, 51-47940, 52-13907, 50-45076, 52-121700, 50-10884, and 50-45087; German Patent Nos. 2,349,948 and 2,616,276.

In order to make these polymers soluble or expandably wettable in alkaline water, it is useful that carboxylic acid, sulfonic acid, phosphonic acid, phosphonic acid, and alkaline metal salt or ammonium salt thereof and acid radical whose pKa is 6 to 12 dissociated in alkaline water or the like is contained in the polymers. Thirteen kinds of monomers having the above acid radicals and monomers having maleimide groups can be co-polymerized as required.

The acid value of the maleimide polymer having an acid radical is preferably within the range of 30 to 300. Among the polymers having such acid value, a copolymer between N-[2-(methacryloiloxy) ethyl]-2, 3-dimethyl maleimide and methacrylic acid or acrylic acid disclosed in Die Angewandte Makromolekulare Chemie 128 (1984) pp. 71 to 91 is useful. Further, in synthesizing this copolymer, a vinyl monomer being a third component is co-polymerized, thereby making it possible to easily synthesize a multiple co-polymer according to its purpose. For example, as a vinyl monomer being the third component, alkyl methacrylate or alkyl acrylate whose homopolymer's glass transfer point is below room temperature is employed, thereby making it possible to impart flexibility to the copolymer.

Photo-cross linking polymers having a cinnamyl group, a cinnamoyl group, a cinnamylidene group, a cinnamylidene acetyl group or a chalcone group and the like on its side or main chain include photosensitive polyesters disclosed in the specifications of U.S. Pat. No. 3,030,208, U.S. patent applications No. 709,496, and 828,455.

Polymers produced by making these photo-cross linking polymers alkali-soluble are as follows:

That is, photosensitive polymers as disclosed in Japanese Patent Laid-Open No. 60-191244 can be exemplified.

Further, photosensitive polymers or the like disclosed in Japanese Patent Laid-Open Nos. 62-175729, 62-175730, 63-25443, 63-218944, and 63-218945 can be exemplified.

Furthermore, sensitizing agents can be used for a photosensitive layer including these polymers. Such senstilizing agents include benzophenone derivative, benzanthrone derivative, quinones, aromatic nitride compound, naphthothiazoline derivative, benzothiazoline derivative, thioxanthones, naphthothiazol derivative, keto-coumarin compound, benzothiazol derivative, naphthofuranone compound, birylium salt, thiabirylium salt or the like. For such photosensitive layer, there can be used, as required, copolymers with at least one kind of monomers such as chlorinated polyethylene, chlorinated polypropylene, alkyl polyacrylate ester, alkyl acrylate ester, acrylonitryl, vinyl chloride, styrene, butadiene; binders such as polyamide, methyl cellulose, polyvinyl formal, polyvinyl butyral, methacrylic acid copolymer, acrylic acid copolymer, and itaconic acid copolymer; dialkyl phthalate ester such as dibutyl phthalate or dihexyl phthalate; or plasticizer such as oligo ethylene glycol alkyl ester or phosphate ester. In addition, for the purpose of coloring of the photosensitive layer, it is preferable that pH support medicine is added as a dye or pigment or a burning agent.

Photo-polymeric photosensitive compositions include unsaturated carboxylic acid and its salt; ester of unsaturated carboxylic acid and aliphatic polyvalent alcohol compound; and amide of unsaturated carboxylic acid and aliphatic polyvalent amine compound.

Photo-polymerization initiators include bicynal polytaketardonyl compound, $\alpha$-carbonyl compound, acyloin ether, aromatic acyloin compound substituted by hydrocarbon on $\alpha$-position, polynuclear quinone compound, a combination of triarylimidazol dimer and p-amino phenyl ketone, benzothiazol based compound, trihalomethyl-s-triazine compound, acridine and phenazine compound, oxadiazol compound or the like. Together with these compounds, polymers soluble or expandably wettable in alkaline water and capable of being filmed include a copolymer of benzyl (meta) acrylate/(meta) acrylic acid/other added polymeric vinyl monomer, as required; a copolymer of methacrylic acid/methyl methacrylic acid (or methacrylate ester acid); and a copolymer having pentaerythritol triacrylate added to maleic anhydride copolymer through semi-esterification or acidic vinyl copolymer and the like.

[IV] Photosensitive layer for electronic photography

For example, a ZnO photosensitive layer disclosed in the specification of U.S. Pat. No. 3,001,872 can be employed. In addition, photosensitive layers employing an electronic photography photosensitive elements disclosed in Japanese Patent Laid-Open Nos. 56-161550, 60-186847, and 61-238063 may be employed.

The quantity of the photosensitive layer provided on the support element is within the range of about 0.1 to about 7 $g/m^2$ in dry weight after application, and preferably, is within the range of 0.5 to 4 $g/m^2$.

In a method for manufacturing a planographic printing plate support element according to the present invention, an intermediate layer may be provided as required for the purpose of improving adhesion between the support element and photosensitive layer; preventing a photosensitive layer from remaining after development; or preventing halation or the like.

For the improvement of adhesion, in general, an intermediate layer is made of a diazo resin or phosphate compound adsorbed by aluminum, amino compound, carboxylic acid compound or the like. In order to prevent the photosensitive layer from remaining after development, the intermediate layer made of a substance with its high solubility is generally made of polymers with its good solubility or water-soluble polymers. For the prevention of halation, the intermediate layer generally contains dyes or UV absorbent. The thickness of the intermediate layer is arbitrary, and must be capable of being subject to uniform bonding and forming reaction with the upper photosensitive layer during exposure. In general, the applying rate of about 1 to 100 $mg/m^2$ in dry solid is appropriate, and particularly, the rate of 5 to 40 mg/$m^2$ is appropriate.

A mat layer composed of projections mutually provided independently can be provided on an applied photosensitive layer.

The object of the mat layer is to reduce a vacuuming time, and further, to prevent crush of microscopic dots during exposure due to a contact failure by improving vacuum adhesion between a negative image film and a photosensitive planographic printing plate in contact exposure.

Methods for coating the mat layer include thermally fusing solid powders disclosed in Japanese Patent Laid-Open No. 55-12974; and spraying polymer-containing water to the mat layer and drying the layer disclosed in Japanese Patent Laid-Open No. 58-182636. Although any of these methods may be employed, it is desirable that the mat layer itself is dissolved in an aqueous alkaline developing liquid substantially free of any organic solvent or can be removed by the developing liquid.

As described above, after the anodic oxidation skin film is formed, an anodic oxidation skin film is etched in order to optimize adhesion between each support element and a photosensitive composition. Then, pore sealing treatment is carried out by steam and hot water. As a result, there is provided a pore sealing treatment apparatus for a support element imparting a photosensitive printing plate having its good stability with an elapse of time and good developing properties, and free of dirt at the non-image portion (Japanese Patent Publication No. 56-12518). Post-processing for generating a skin film may be carried out in such apparatus. In addition, pore sealing treatment may be carried out with the apparatuses and methods disclosed in Japanese Patent Laid-Open Nos. 4-4194, and Japanese Patent Application Nos. 4-33952, 4-33951 and 3-315245.

Further, there can be applied potassium zirconium acid fluoride treatment disclosed in the specification of U.S. Pat. No. 2,946,638; phosphomolybdate treatment disclosed in the specification of U.S. Pat. No. 3,201,247; alkyl titanate treatment disclosed in the specification of British Patent No. 1108559; polyacrylic acid treatment disclosed in the specification of German Patent No. 1091433; polyvinyl phosphonic acid treatment disclosed in the specification of German Patent No. 1134093 or British Patent No. 1230447; phosphonic acid treatment disclosed in Japanese Patent Publication No. 44-6409; phytic acid treatment disclosed in the specification of U.S. Pat. No. 3,307,951; treatment which a divalent metal salt of a lipophilic organic polymeric compound disclosed in Japanese Patent Laid-Open No. 58-16893 or 58-18291; providing an undercoat layer of hydrophilic cellulose (for example, carboxymethyl cellulose) containing a water-soluble metal salt (for example, zinc acetate) as disclosed in the specification of U.S. Pat. No. 3,860,426; undercoating a water-soluble polymer having a sulfonic acid radical, thereby making it hydrophilic disclosed in Japanese Patent Laid-Open No. 59-101651; undercoating of phosphate disclosed in Japanese Patent Laid-Open No. 62-019494; of a water-soluble epoxy compound disclosed in Japanese Patent Laid-Open No. 62-033692; of phosphate-modified starch disclosed in Japanese Patent Laid-Open No. 62-097892; of diamine compound disclosed in Japanese Patent Laid-Open No. 63-056498; of inorganic or organic animo acid disclosed in Japanese Patent Laid-Open No. 63-130391; of organic phosphonic acid containing a carboxyl group or hydroxyl group disclosed in Japanese Patent Laid-Open No. 63-145092; of a compound having an amino group and a phosphonic acid radical disclosed in Japanese Patent Laid-Open No. 63-165183; of a specific carboxylic acid derivative disclosed in Japanese Patent Laid-Open No. 2-316290; of a phosphate ester disclosed in Japanese Patent Laid-Open No. 1-272594; of compound having one amino group and one phosphorous oxygen acid radical disclosed in Japanese Patent Laid-Open No. 3-261592; of phosphate ester disclosed in Japanese Patent Laid-Open No. 3-215095; of aliphatic or aromatic phosphonic acid such as phenylphosphonic acid disclosed in Japanese Patent Laid-Open No. 5-246171; compound containing S atoms such as thiosalicylic acid disclosed in Japanese Patent Laid-Open No. 1-307745 and of a compound having a phosphorous oxygen acid radical disclosed in Japanese Patent Laid-Open No. 4-282637; and coloring with acidic dye disclosed in Japanese Patent Laid-Open No. 60-64352.

The support element according to the present invention is provided with a photosensitive layer embodied below to make a photosensitive planographic printing plate.

[I] When a photosensitive layer containing o-naphthoquinonediazide sulfonic acid ester and phenol cresol mixed novolac resin is provided o-quinonediazide compounds are o-naphthoquinonediazide compounds, and are disclosed in a number of publications including the specifications of U.S. Pat. Nos. 2,766,118, 2,767,092, 2,772,972, 2,859,112, 3,102,809, 3,106,465, 3,635,709, and 3,647,443. These compounds can be preferably used. Particularly preferred among them are o-naphthoquinonediazide sulfonic acid esters or o-naphthoquinonediazide carboxylic acid esters of aromatic hydroxy compounds; and o-naphthoquinonediazide sulfonic acid amides or o-naphthoquinonediazide carboxylic acid amides of aromatic animo compounds. In particular, very excellent are ester reaction product of o-naphthoquinonediazide sulfonic acid with a condensation product of pyrogallol and acetone disclosed in the specification of U.S. Pat. No. 3,635,709; ester reaction product of o-naphthoquinonediazide sulfonic acid or o-naphthoquinonediazide carboxylic acid with a polyester having a hydroxy group at its end disclosed in the specification of U.S. Pat. No. 4,028,111; ester reaction product of o-naphthoquinonediazide sulfonic acid or o-naphthoquinonediazide carboxylic acid with a p-hydroxy styrene homopolymer or copolymer with other copolymerizable monomers as disclosed in British Patent No. 1,494,043; amide reaction product of o-naphthoquinonediazide sulfonic acid or o-naphthoquinonediazide carboxylic acid with a copolymer of p-amino styrene and other copolymerizable monomers as disclosed in the specification of U.S. Pat. No. 3,759,711.

These o-quinonediazide compounds can be used singly, but it is preferable to use them mixed with an alkali-soluble resin. Preferable alkali-soluble resins include novolac type phenol resins, specifically phenol formaldehyde resins, o-cresol formaldehyde resins, m-cresol formaldehyde resins or the like. Further, it is more preferable to use the above-mentioned phenol resin together with a condensation product of phenol substituted by an alkyl group having 3 to 8 carbons or cresol and formaldehyde such as t-butyl phenol formaldehyde resin as disclosed in the specification of U.S. Pat. No. 4,028,111.

In addition, in order to form a visible image with exposure, there are added compounds such as o-naphthoquinonediazide-4-sulfonyl chloride; inorganic anion salt of p-diazodiphenyl amine; trihalomethyloxadiazol compound; trihalomethyloxadiazol compound having a benzofuran ring or the like. Image coloring agents include triphenyl methane dyes such as Victoria Blue BOH, Crystal Violet, and Oil blue. A dye disclosed in Japanese Patent Laid-Open No. 62-293247 is particularly preferred.

Further, grease sensing agents can include a phenol substituted by an alkyl group having 3 to 15 carbons as disclosed in Japanese Patent Publication No. 57-23253, for example, t-butyl phenol, N-octyl phenol, a novolac resin obtained by condensation of t-butyl phenol and formaldehyde, or o-naphthoquinonediazide-4- or -5-sulfonic acid ester of such novolac resin (disclosed in Japanese Patent Laid-Open No. 61-242446, for example).

Furthermore, in order to improve developing properties, it can contain a non-ionic surface active agent as disclosed in Japanese Patent Laid-Open No. 62-251740.

The above composition is dissolved in a solvent for solving each of the components, and is applied onto the support element. Solvents to be used here include ethylene dichloride, cyclohexanone, methyl ethyl ketone, ethylene glycol monomethyl ether, etylene glycol monoethyl ether, 2-methoxy ethyl acetate, 1-methoxy-2-propanol, 1-methoxy-2-propyl acetate, methyl lactate, ethyl lactate, dimethyl sulfoxide, dimethyl acetoamide, dimethyl formamide, water, N-methyl pyrrolidone, tetrahydrofulfuryl alcohol, acetone, diacetone alcohol, methanol, ethanol, isopropanol, diethylene glycol dimethyl ether or the like, and these solvents are used singly or in mixture.

A photosensitive composition comprising these components is provided as a solid component by 0.5 to 3.0 g/$m^2$.

[II] When a photosensitive layer containing a diazo resin and a water-insoluble and lipophilic polymeric compound is provided Diazo resins include, for example, organic-solvent-soluble diazo resin in organic salts that are reaction products of a condensation product of p-diazodiphenyl amine and formaldehyde or acetoaldehyde; and hexafluorophosphate or tetrafluoro borate; and organic-solvent-soluble diazo resin inorganic salts that are reaction products of the above condensation product and sulfonic acids, for example, p-toluenesulfonic acid or its salts; phosphinic acids, for example, benzenephosphinic acid or its salts; and hydroxyl-group-containing compounds, for example, 2, 4-dihydroxy benzophenone, 2-hydroxy-4-methoxybenzophenone-5-sulfonic acid or its salts as disclosed in the specification of U.S. Pat. No. 3,300,309.

In the present invention, other diazo resins that can be preferably employed include co-condensation products containing as a structural unit, aromatic compounds having at least one organic group of a carboxyl group, sulfonic acid radical, sulphinic acid radical, phosphorous oxygen acid radical, and hydroxyl group; and diazonium compounds, preferably aromatic diazonium compounds.

Preferably, the above aromatic rings can include a phenyl group or a naphthyl group.

There are exemplified various aromatic compounds containing at least one of the aforementioned carboxyl group, sulfonic acid radical, sulphinic acid radical, a phosphorous oxygenic acid radical, and hydroxyl group. Preferably, these include 4-methoxy benzoic acid, 3-chlorobenzoic acid, 2, 4-dimethoxy benzoic acid, p-phenoxy benzoic acid, 4-anilinobenzoic acid, phenoxy acetatic acid, phenyl acetatic acid, p-hydroxy benzoic acid, 2, 4-dihydroxy benzoic acid, benzene sulfonic acid, p-toluene sulphinic acid, 1-naphthalene sulfonic acid, phenyl phosphonic acid, phenyl phosphonic acid or the like. A diazonium salt as disclosed in Japanese Patent Publication No. 49-48001, for example, can be employed for an aromatic diazonium compound as a constituent unit of the aforementioned co-condensed diazo resin, and in particular, diphenyl amine-4-diazonium salts are preferred.

Diphenylamine-4-diazonium salts are derived from 4-amino-diphenyl amines. Such 4-amino-diphenyl amines includes 4-amino diphenyl amine, 4-amino-3-methoxy diphenyl amine, 4-amino-2-methoxy diphenyl amine, 4'-amino-2-methoxy diphenyl amine, 4'-amino-4-methoxy diphenyl amine, 4-amino-3-methyl diphenyl amine, 4-amino-3-ethoxy diphenyl amine, 4-amino-3-β-hydroxy ethoxy diphenyl amine, 4-amino-diphenyl amine-2-sulfonic acid, 4-amino-diphenyl amine-2-carboxyl acid, 4-amino-diphenyl amine-2'-carboxylic acid or the like. 3-methoxy-4-amino-4-diphenyl amine and 4-amino diphenyl amine are particularly preferred.

In addition, as diazo resins other than diazo resins co-condensed with an aromatic compound having an acid radical, aldehyde containing an acidic radical and diazo resins condensed with its acetal compound disclosed in Japanese Patent Laid-Open Nos. 4-18559, 3-163551, and 3-253857 can be preferably used.

Paired anions of diazo resins include anions that constantly form salts with diazo resins, and that make the resins soluble in organic solvent. These include organic carboxylic acids such as decanoic acid and benzoic acid; organic phosphonic acids such as phenyl phosphoric acids; and sulfonic acids. Typical examples include aliphatic and aromatic sulfonic acids such as methanesulfonic acid, fluoroalkane sulfonic acid such as trifluoro methanesulfonic acid, lauryl sulfonic acid, dioctyl sulfonesuccinic acid, dicyclohexyl sulfonesuccinic acid, campher-sulfonic acid, tolyloxy-3-propane sulfonic acid, nonyl phenoxy-3-propane sulfonic acid, nonyl phenoxy-4-butane sulfonic acid, dibutyl phenoxy-3-propane sulfonic acid, diamyl phenoxy-3-propane sulfonic acid, dinonyl phenoxy-3-propane sulfonic acid, dibuthyl phenoxy-4-butane sulfonic acid, dinonyl phenoxy-4-butane sulfonic acid, benzene sulfonic acid, toluene sulfonic acid, mesitylene sulfonic acid, p-chlorobenzene sulfonic acid, 2, 5-dichlorobenzene sulfonic acid, sulfosalicylic acid, 2, 5-dimethyl benzene sulfonic acid, p-acetyl benzene sulfonic acid, 5-nitro-o-toluene sulfonic acid, 2-nitrobenzene sulfonic acid, 3-chlorobenzene sulfonic acid, 3-bromobenzene sulfonic acid, 2-chloro-5-nitrobenzene sulfonic acid, butyl benzene sulfonic acid, octyl benzene sulfonic acid, decyl benzene sulfonic acid, dodecyl benzene sulfonic acid, butoxy benzene sulfonic acid, dodecyloxybenzene sulfonic acid, 2-hydroxy-4-methoxy benzophenone-5-sulfonic acid, isopropyl naphthalene sulfonic acid, butyl naphthalene sulfonic acid, hexyl naphthalene sulfonic acid, octyl naphthalene sulfonic acid, buthoxy naphthalene sulfonic acid, dodecyloxynaphthalene sulfonic acid, dibutyl naphthalene sulfonic acid, dioctyl naphthalene sulfonic acid, triisopropyl naphthalene sulfonic acid, tributyl naphthalene sulfonic acid, 1-naphthol-5-sulfonic acid, naphthalene-1-sulfonic acid, naphthalene-2-sulfonic acid, 1, 8-dinitro-naphthalene-3, 6-disulfonic acid, and dimethyl-5-sulfoisonaphthalate; hydroxyl group-containing aromatic compounds such as 2, 2', 4, 4'-tetrahydroxy benzophenone, 1,2,3-trihydroxy benzophenone, 2,2',4-trihydroxy benzophenone; halide Lewis acids such as hexafluorophosphoric acid and tetrafluoroboric acid, and perhalogenic acids such as $HClO_4$ and $HIO_4$ without being limited thereto. Among them, butyl naphthalene sulfonic acid, dibutyl naphthalene sulfonic acid, hexafluorophosphonic acid, 2-hydroxy-4-methoxybenzophenone-5-sulfonic acid, and dodecyl benzene sulfonic acid are particularly preferred.

For the diazo resins used in the present invention, molecular weight can be obtained as an arbitrary value by variously changing the molar ratio of each monomer and condensation conditions. In order to effectively use the diazo resins for target applications of the present invention, it is preferable that the molecular weight is about 400 to 100,000, preferably, about 800 to 8,000.

Water-insoluble and lipophilic polymeric compounds include copolymers with molecular weights generally of 10,000 to 200,000, in which monomers shown in the following (1) to (17) are their structural units.

(1) Acrylamides, methacrylamides, acrylate esters, methacrylic acid esters, and hydroxy styrenes having aromatic hydroxyl group, for example, N-(4-hydroxyphenyl) acrylamide or N-(4-hydroxyphenyl) methacrylamide, o-, m-, p-hydroxy styrene, o-, m-, p-hydroxy phenyl-acrylate or methacrylate;

(2) Acrylic acid esters and methacrylic acid esters having an aliphatic hydroxyl group, for example, 2-hydroxy ethyl acrylate or 2-hydroxy ethyl methacrylate, or 4-hydroxy butyl methacrylate;

(3) Unsaturated carboxylic acid such as acrylic acid, methacrylic acid, maleic anhydride, or itaconic acid;

(4) (Substituted) alkyl acrylate such as methyl acrylate, ethyl acrylate, propyl acrylate, butyl acrylate, amyl acrylate, hexyl acrylate, cyclohexyl acrylate, octyl acrylate, benzyl acrylate, 2-chloroethyl acrylate, acrylate glycidyl, N-dimethyl amino ethyl acrylate;

(5) (Substituted) alkyl methacrylate such as methyl methacrylate, ethyl methacrylate, propyl methacrylate, butyl methacrylate, amyl methacrylate, cyclohexylmethacrylate, benzyl methacrylate, glycidyl methacrylate, or N-dimethyl amino ethyl methacrylate;

(6) Acrylamides or methacrylamides such as acrylamide, methacrylamide, N-methylol acryl amide, N-methylol methacrylamide, N-ethyl acrylamide, N-hexyl methacrylamide, N-cyclohexyl acrylamide, N-hydroxy ethyl acrylamide, N-phenyl acrylamide, N-nitrophenyl acrylamide, or N-ethyl-N-phenyl acrylamide;

(7) Vinyl ethers such as ethyl vinyl ether, 2-chloroethyl vinyl ether, hydroxy ethyl vinyl ether, propyl vinyl ether, butyl vinyl ether, octyl vinyl ether, or phenyl vinyl ether;

(8) Vinyl esters such as vinyl acetate, vinyl chloroacetate, vinyl butylate, or vinyl benzoate;

(9) Styrenes such as styrene, a-methyl styrene, or chloromethylstyrene;

(10) Vinyl ketones such as methyl vinyl ketone, ethyl vinyl ketone, propyl vinyl ketone, or phenyl vinyl ketone;

(11) Olefins such as ethylene, propylene, isobutylene, butadien, isoprene;

(12) N-vinylpyrolidone, N-vinylcarbazole, 4-vinylpyridine, acrylonitryl, methacrylonitryl or the like;

(13) Unsaturated imides such as maleimide, N-acryloyl acrylamide, N-aceketyl methacrylamide, N-propionyl methacrylamide, N-(p-chlorobenzoyl) methacrylamide;

(14) Methacrylic acid amides such as N-(o-aminosulfonylphenyl) methacrylamide, N-(m-aminosulfonylphenyl) methacrylamide, N-(p-amino) sulfonyl phenyl methacrylamide, N-(1-(3-amino sulfonyl) naphtyl) methacrylamide, or N-(2-amino sulfonyl ethyl) methacrylamide and acrylamides having a substituent similar to the above; or methacrylic acid esters such as o-amino sulfonyl phenyl bumethacrylate, m-amino sulfonyl phenyl methacrylate, p-amino sulfonyl phenyl methacrylate, 1-(3-amino sulfonyl naphtyl) methacrylate and unsaturated sulfonic amides such as acrylate esters having a substituent similar to the above;

(15) Unsaturated monomer having cross linking group on its side chain such as N-(2-(methacryloyloxy)-ethyl)-2, 3-dimethyl maleimide, and vinyl cinnamate. Further, monomers that can be co-polymerized with any of the above monomers may be co-polymerized.

(16) Phenol resin disclosed in the specification of U.S. Pat. No. 3,751,257 and polyvinyl acetal resin such as polyvinyl formal resin or polyvinyl butyral resin; or

(17) Polymeric compounds which make polyurethane alkali-soluble, disclosed in Japanese Patent Publication No. 54-19773; and Japanese Patent Laid-Open Nos. 57-904747, 60-182437, 62-58242, 62-123452, 62-123453, 63-113450, and 2-146042.

To the above copolymers, a polyvinyl butyral resin, a polyurethane resin, a polyamide resin, an epoxy resin, a novolac resin, a natural resin or the like may be added as required.

For photosensitive compositions employed for the support element according to the present invention, pigments can be employed for the purpose of obtaining visible images due to exposure and visible images after development.

The pigments include triphenyl methane-based, diphenyl methane-based, oxazine-based, xanthene-based, iminonaphthoquinone-based, azomethine-based, or anthraquinone-based pigments represented by Victoria Pure Blue BOH (available from Hodogaya Chemicals Co., Ltd.), Oil Blue #603 (available from Orient Chemical Engineering Co., Ltd.), Patent Pure Blue (available from Sumitomo Mikuni Chemicals Co., Ltd.), Crystal Violet; Brilliant Green, Ethyl Violet; Methyl Violet, Methyl Green, Erythrocin B, Basic Fuchsine; Malachite Green, Oil Red, m-Cresol Purple, Rhodamine B, Auramine, 4-p-diethyl amino phenyl iminaphthoquinone, cyano-p-diethyl amino phenyl acetoanilide or the like as examples of discoloring agents changing from chromic to achromic or differently chromic tones.

On the other hand, discoloring agents changing from achromic tones to chromic tones include leuco pigments and primary or secondary aryl amine-based pigments represented by triphenyl amine, diphenyl amine, o-chloroaniline, 1, 2, 3-triphenyl guanidine, naphtyl amine, diamino diphenyl methane, p, p'-bis-dimethyl amino diphenyl amine, 1, 2-dianilinoethylene, p, p', p"-tris-dimethyl amino triphenyl methane, p, p'-bis-dimethyl animo diphenyl methyl imine, p, p', p"-triamino-o-methyl triphenyl methane, p, p"-bis-dimethyl amino diphenyl-4-anilino naphtyl methane, and p, p', p"-triamino triphenyl methane. Particularly preferably, tripheyl methane-based and diphenyl methane-based pigments are effectively employed. Further preferably, triphenyl methane-based pigments are employed. Particularly, Victoria Pure Blue BOH is employed.

A variety of additives can be further added to photosensitive compositions employed for the support element according to the present invention.

For example, there are preferably employed alkyl ethers for improving coating properties (for example, ethyl cellulose or methyl cellulose); fluorine-based surface active agents; nonionic surface active agents (in particular, fluorine-based surface active agents are preferred.); plasticizer for imparting flexibility and friction resistance of a coat film (for example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomer and polymer of acrylic acid or methacrylic acid. Among them, tricresyl phosphate is particularly preferred.); grease sensing agent for improving grease sensitivity of an image portion (for example, semi-esterification product of styrene-maleic anhydride copolymer with alcohol, novolac resin such as p-t-butyl phenol-formaldehyde resin, 50% aliphatic acid ester of p-hydroxy styrene or the like disclosed in Japanese Patent Laid-Open No. 55-527); stabilizer (for example, phosphate, phosphorous acid, organic acid (citric acid, oxalic acid, dipicolinic acid, benzene sulfonic acid, naphthalene sulfonic acid, sulfosalicylic acid, 4-methoxy-2-hydroxy benzophenone-5-sulfonic acid, tartaric acid or the like)), accelerators (for example, higher alcohol, acidic anhydride or the like).

To provide the above mentioned photosensitive components on the support element, a photosensitive diazo resin, a lipophilic polymeric compounds, and a predetermined amount of various additives as required are dissolved in appropriate solvents (methyl cellosolve, ethyl cellosolve, dimethoxy ethane, diethylene glycol monomethyl ether, diethylene glycol dimethyl ether, 1-methoxy-2-propanol, methyl cellosolve acetate, acetone, methyl ethyl ketone, methanol, dimethyl formamide, dimethyl acetoamide, cyclo hexane, dioxane, tetrahydrofuran, methyl lactate, ethyl lactate, ethylene dichloride, dimethyl sulfoxide, water or a mixture thereof and the like), a coat liquid of photosensitive compositions is adjusted, and then, the adjusted liquid may be applied onto the support element to be dried.

The photosensitive compositions are dissolved in the above solvents for dissolving the components, and are applied onto the aluminum plate being a support element. As the solvents to be used here, organic solvents as disclosed in Japanese Patent Laid-Open Nos. 62-251739 and 6-242597 are employed singly or in mixture.

The photosensitive compositions are decomposed and dispersed at a solid component concentration of 2 to 50 wt. %, are applied onto the support element, and are dried.

The applying quantity of the layer (photosensitive layer) of the photosensitive compositions applied onto the support element differs depending on its uses. In general, the weight after dry is preferably 0.3 to 4.0 $g/m^2$. As the applying quantity decreases, the quantity of exposure for obtaining an image decreases; however, the film strength is lowered. As the applying quantity increases, a larger quantity of exposure is required; however, the photosensitive film becomes strong. For example, when this photosensitive film is employed as a printing plate, the printing plate with a large number of printouts (with its high printout capability) can be obtained.

Into the photosensitive compositions, a surface active agent for improving the quantity of the applied face, in particular, preferably, fluorine-based surface active agent can be added.

For the manufacture of a photosensitive planographic printing plate, any of a back coat layer being a back face and a photosensitive composition layer being a top face may be coated first onto the support element, and both of them may be coated simultaneously.

Methods for coating the photosensitive compositions can include a method employing coating rods disclosed in Japanese Patent Publication No. 58-4589 and Japanese Patent Laid-Open No. 59-123568 or the like; a method employing an extrusion type coater disclosed in Japanese Patent Laid-Open No. 4-244265 or the like; and a method employing a slide bead coater disclosed in Japanese Patent Publication 1-57629 and Japanese Patent Laid-Open No. 10-128212 or the like.

Hereinafter, some of these methods will be described in detail.

Examples and Comparative Examples

A roller containing a polishing agent of 6 μm in average particle size in a non-woven cloth in which JIS1050 material is composed of polyester was subject to preliminary polishing and water washing while the rotation frequency and pushing quantity were changed properly. The surface engraved by preliminary polishing was obtained by a weighing method. Then, temperature or concentration was properly changed by a caustic soda liquid, and the aluminum surface was etched. The quantity dissolved by such etching was also obtained by the weighing method. Then, the aluminum surface was washed with water, and was de-smutted with a liquid of 1% and 50° C. Then, using the waveform disclosed in Japanese Patent Laid-Open No. 3-79399, the current density and the quantity of electricity were properly changed with 1% nitrate and at frequency 50 Hz and the aluminum concentration of 4 g/L. Then, the aluminum surface was washed with water, and was properly etched with a caustic soda, and a different surface shape was produced. Then, the surface was washed with water, and a skin film was produced so that the anodic oxidation skin film quantity is 2.6 $g/m^2$ at 45° C. with sulfate of 120 g/L. Thereafter, the values of material properties in the claims were measured. The measurement results of the preliminary polishing quantity and the values of the material properties are shown in Tables 1 and 2.

A photosensitive layer was coated to those shown in Examples and Comparative Examples, and the printing performance was verified.

TABLE 1

| Examples | Preliminary polishing (μm) | Chemical etching (μm) | Area S ($\mu m^2$) | Ra (μm) | Rp (μm) | Rmax (μm) | Surface area difference (%) |
|---|---|---|---|---|---|---|---|
| Examples | | | | | | | |
| 1 | 0.1 | 0.2 | 40 | 0.18 | 0.81 | 1.81 | 40 |
| 2 | 0.2 | 0.1 | 100 | 0.30 | 1.25 | 3.1 | 30 |
| 3 | 1.3 | 0.6 | 80 | 0.55 | 2.95 | 5.1 | 25 |
| 4 | 2.7 | 1.5 | 145 | 0.22 | 1.30 | 2.1 | 60 |
| 5 | 0.8 | 3.3 | 35 | 0.58 | 2.4 | 5.3 | 65 |
| 6 | 1.2 | 1.1 | 32 | 0.44 | 2.1 | 4.1 | 57 |
| 7 | 0.8 | 0.6 | 148 | 0.60 | 3.5 | 5.8 | 65 |
| 8 | 0.2 | 0.3 | 40 | 0.15 | 0.75 | 1.5 | 23 |

TABLE 2

Comparative Examples

| Comparative Examples | Preliminary polishing ($\mu$m) | Chemical etching ($\mu$m) | Area S ($\mu m^2$) | Ra ($\mu$m) | Rp ($\mu$m) | Rmax ($\mu$m) | Surface area difference (%) |
|---|---|---|---|---|---|---|---|
| 1 | 0.08 | 0.22 | 50 | 0.18 | 0.80 | 1.7 | 30 |
| 2 | 0.3 | 0.07 | 45 | 0.56 | 2.94 | 5.0 | 60 |
| 3 | 1.9 | 1.8 | 25 | 0.45 | 2.3 | 4.3 | 55 |
| 4 | 2.2 | 0.3 | 160 | 0.48 | 2.4 | 5.0 | 65 |
| 5 | 0.9 | 0.8 | 60 | 0.13 | 0.70 | 1.2 | 40 |
| 6 | 1.9 | 1.5 | 70 | 0.64 | 3.61 | 6.3 | 60 |
| 7 | 2.1 | 0.5 | 90 | 0.51 | 3.2 | 5.05 | 55 |
| 8 | 0.6 | 3.5 | 70 | 0.29 | 1.2 | 3.8 | 45 |
| 9 | 0.2 | 2.8 | 65 | 0.51 | 3.0 | 5.2 | 17 |

In Examples 1 to 8, proper printing resistance (at least 200,000 pieces) was obtained, and printing was possible with inconsiderable dirt and proper quantity of water. In Comparative Example 1, there was a site at which the printing resistance of the dot portion was at most 1000 pieces. When this site was observed by electronic microscope, there was a portion at which irregularities were not formed by electrochemical roughening (0.1 mm in width and about 2 mm in length). When element analysis was carried out, a copper segregated site was observed. This is considered to occur because mechanical preliminary polishing is at most 0.1 $\mu$m.

In Comparative Example 2, in the case where the printing resistance was about 10,000 pieces, electrochemically roughened irregularities were microscopically observed to have been non-uniform. This is considered to occur because chemical etching is at most 0.1 $\mu$m, and the oxidation skin film on the surface cannot be removed completely.

In Comparative Examples 3 and 4, the printing resistances were about 40,000 pieces. In Comparative Example 5, a printing plate face was lustered during printing, water adjustment was difficult, and proper printing was impossible. The failure that occurred in Comparative Example 3 is considered to be because an area S is at most 30 $\mu m^2$. In addition, the failure that occurred in Comparative Example 4 is considered to be because the area S is at least 150 $\mu m^2$. Therefore, it was judged that the area S is preferably within the range of 30 $\mu m^2 \leqq S \leqq 150\ \mu m^2$. The failure in Comparative Example 5 is considered to occur because Ra is at most 0.15 $\mu$m.

In Comparative Examples 6, 7, and 8, dirt easily occurred, ink slightly remained at a non-image portion, and proper printing was impossible. The failure in Comparative Example 6 is considered to occur because Ra is at least 0.60 $\mu$m. Therefore, it was judged that the Ra is preferably within the range of 0.15 $\mu m \leqq Ra \leqq 0.60\ \mu m$ from the foregoing Examples and Comparative Examples. The failure in Comparative Example 7 is considered to occur because $Rp \leqq 6\ Ra$. In addition, the failure that occurred in Comparative Example 8 is considered to be because $Rmax \leqq 12\ Ra$.

In Comparative Example 9, the printing resistance was less than 10,000 pieces. The failure in Comparative Example 9 is considered to occur because a surface area difference is at most 20%.

From the above results, after the surface of an aluminum plate was preliminarily polished mechanically by at least 0.1 $\mu$m, was chemically etched by at least 0.1 $\mu$m, and then, was electrochemically surface-roughened and anode-oxidized, it was judged that stability of the small dot net portion can be obtained due to improvement of productivity and improvement of adhesion, in the case where the surface structure of the foregoing aluminum plate experienced n the above process is characterized in that:

(a) an area (S) for a graphic formed by a reference straight line drawn from a top of a third highest mountain of a two-dimensional roughness curve downwardly by 1 $\mu$m and a roughness curve above the reference straight line is 30 $\mu m^2 \leqq S \leqq 150\ \mu m^2$;

(b) an average roughness Ra of average lines is 0.15 $\mu m \leqq Ra \leqq 0.60\ \mu m$;

(c) a relationship between the average roughness Ra of average lines and a height Rp of a center line is $Rp \leqq 6Ra$;

(d) a relationship between a maximum height Rmax and the average roughness Ra of average lines is $Rmax \leqq 12Ra$; and (e) a surface area difference is between 20% and 70%.

Hereinafter, preferred embodiments of the method and apparatus for preliminarily polishing a non-woven cloth roller and a metal plate for printing plate according to the present invention will be now described in detail with reference to the accompanying drawings.

FIG. 1 is a structural view showing a fundamental constituent elements of an apparatus for preliminarily polishing a metal plate for printing plate according to the present invention.

A preliminary polishing apparatus 10 is primarily composed of: a non-woven cloth roller 14 disposed at one side at which a printing form metal plate 12 is sandwiched; a pair of support rollers 16, 16 disposed at the other side, the rollers supporting the metal plate for printing plate 12; a forwarding and retracting device 18 for pressing the non-woven cloth roller 14 to the support rollers 16 side, and pushing the metal plate for printing plate 12 between a pair of the non-woven cloth rollers; and a water supply device 20 for supplying water to the surface of the metal plate for printing plate 12.

In the non-woven cloth roller 14, a cylindrical core member 24 is engagingly locked with a rotary shaft 22, a cylindrical non-woven cloth 26 is engagingly locked with the peripheral face of its core member 24, and the rotary shaft 22 is coupled with a motor 32 with its adjustable rotation speed. As the non-woven cloth 26 of the non-woven cloth roller 14, a variety of non-woven cloths can be used. For example, the non-woven cloths made of polyamide, polyester, nylon, rayon or the like can be employed, and it is preferable that the surface hardness is at least 20 degrees in a state in which the non-woven cloth roller 14 is formed. In addition, a polishing agent is contained in the non-woven cloth 26 of the non-woven cloth roller 14. As the polishing agent, diamond sand, silicon sand, alumina powders, silicon carbide or the like can be used.

The thus polishing agent-containing non-woven cloth roller 14 is structured so that the roller can be forwarded and retracted by means of the forwarding and retracting device 18 by about 100 mm in A-B direction indicated by the arrow.

The roller is structured so as to be pushed between a pair of support rollers 16. This pushing quantity is changed, and the polishing pressure is controlled, whereby the preliminary polishing quantity is adjusted. In addition, the non-woven cloth roller 14 is pushed between a pair of support rollers 16 via the metal plate for printing plate 12, whereby making it possible to ensure preliminary polishing while the non-woven cloth roller 14 is brought into face contact with the metal plate for printing plate 12.

A pair of support rollers 16 for supporting the metal plate for printing plate 12 is structured of having a cylindrical hard rubber or a metal cylinder engagingly locked with the rotary shaft 28. In addition, an arrangement is provided such that a spaced distance (L) between a pair of support rollers 16 is shorter than a diameter (D) of the non-woven cloth roller 14. This pair of support rollers 16 rotate at a speed equal to the running speed of the metal plate for printing plate 12. Then, the non-woven cloth roller 14 is pushed between a pair of support rollers 16 via the metal plate for printing plate 12, and is polished in a state in which the non-woven cloth roller 14 is brought into face contact with the surface of the metal plate for printing plate 12.

A pair of the water supply devices 20 are disposed on the upstream side and downstream side of the non-woven cloth roller 14 in the running direction of the metal plate for printing plate 12. In water supply to a surface, water may be directly supplied to the running metal plate for printing plate 12 or water may be supplied indirectly to the surface of the non-woven cloth roller 14. The non-woven cloth roller 14 has its slight water preserving properties, and thus, water supply to the non-woven cloth roller 14 can be managed more easily.

The metal plate for printing plate 12 is guided from a unwinding device (not shown), is inserted between the aforementioned non-woven cloth roller 14 and each of the support rollers 16, 16, and is connected to a winding device 30. Then, the winding device 30 winds up the metal plate for printing plate 12, whereby allowing the metal plate for printing plate to run. In addition, the winding speed of the winding device 30 is varied, whereby adjusting the running speed of the metal plate for printing plate 12.

In one of the preferred embodiments according to the present invention, the following additional structure is further provided based on the above structured preliminary polishing apparatus 10.

A polishing agent contained in the non-woven cloth of the above mentioned non-woven cloth roller is constituted so that its average particle size is at most 50 $\mu$m, the maximum particle size is at most 60 $\mu$m, and the density of the polishing agent is at least 60% on the fiber surface of the non-woven cloth. In this case, the smaller the average particle size is, the better it is, as long as the size is at most 50 $\mu$m and the polishing agent works properly. In addition, the finer the finer the maximum particle size is, the better it is, as long as the size is at most 60 $\mu$m and the polishing agent works properly. It is sufficient that the density of the polishing agent is at least 60%. Preferably, the density with its margin of at least +10% should be set in consideration of slip-off of the polishing agent during preliminary polishing.

In measurement of the average particle size and the maximum particle size, 10 $cm^3$ of the non-woven cloth fiber of the non-woven cloth roller was immersed in a solvent, a binder which was fixing the polishing agent was dissolved, only the polishing agent was sampled, the sampled polishing agent was measured by a granularity distribution measuring instrument. In measuring the density of the polishing agent, non-woven fiber was scanned in three fields of view at a magnification of ×150 using a scanning type microscope, and then, the fixing density of the polishing agent per certain surface area of the non-woven cloth fiber was calculated.

To obtain a polishing agent which satisfies this particle size, the material of the polishing agent is milled by a miller, and the milled material is classified into a plurality of particle groups in units of 5 $\mu$m in average particle size by a floating mine selection method, a drawing separation method or the like with the average particle size being a scale. From among the classified particle groups, a first selection is made so as to first select a particle group satisfying a condition in which the average particle size is at most 50 $\mu$m. A plurality of particle groups in which the average particle size is classified as at most 50 $\mu$m similarly are prepared. Next, from among the particle groups that satisfy a condition in which the average particle size is at most 50 $\mu$m, a second selection is made so as to select a particle group satisfying a condition in which the maximum particle size is at most 60 $\mu$m with the maximum particle size being a scale. Lastly, the particle groups passing the first and second selections are collected so as to obtain polishing agent in quantity which is sufficient to be contained in the non-woven cloth of the non-woven cloth roller.

The thus obtained polishing agent having at most 50 $\mu$m in average particle size and at most 60 $\mu$m in maximum particle size is contained in the non-woven cloth so that the density of the polishing agent is at least 60% on the fiber surface of the non-woven cloth. As a method for containing the polishing agent, for example, a Dip method can be adopted. That is, the polishing agent obtained by the classification is dispersed into a phenol solution of a styrene butadiene rubber (binder). Then, the non-woven cloth of the non-woven cloth roller is partly immersed in a dispersion of polishing agent. In this state, the non-woven cloth roller is rotated at a constant speed. In this manner, the dispersion of polishing agent is impregnated uniformly in the non-woven cloth. Next, the non-woven cloth roller having the polishing agent dispersion liquid impregnated therein is dried, and the phenol liquid is removed. In this manner, the polishing agent is fixed to the fiber surface of the non-woven cloth by the binder. At this time, while the rotation speed of the non-woven cloth roller is adjusted or an excess of dispersion of polishing agent is rubbed off by a squeezing roller after impregnation, an attempt is made to ensure that the density of the polishing agent on the fiber surface of the non-woven cloth is at least 60%. Any method for obtaining the polishing agent according to the present invention is applicable without being limited to the above classification or Dip method as long as the condition relative to the average particle size, the maximum particle size, and density can be satisfied.

According to the preferred embodiments of the present invention constituted above, a metal plate for printing plate is preliminarily polished by using a non-woven cloth roller in which the average particle size of the polishing agent contained in a roll-shaped non-woven cloth is at most 50 $\mu$m; the maximum particle size is at most 60 $\mu$m; and the density of the polishing agent is at least 60% on the fiber surface of the non-woven cloth. Thus, the polishing streaks due to the polishing agent do not occur on the surface of the metal plate for printing plate in preliminary polishing, and the graining failure can be prevented while in the polishing.

In this case, the values of the average particle size of the polishing agent contained in the non-woven cloth, the maximum particle size thereof, and the density of the fiber surface of the non-woven cloth may be equal to at least the values set prior to starting use of the non-woven cloth roller, and further, these values are preferably maintained after the use. In particular, there is a possibility that the density is decreased due to the slip-off of the polishing agent through polishing. Thus, a value with its margin of at least +10% should be set more preferably than the setting of a value very close to 60%.

Examples

Hereinafter, the test result obtained after preliminary polishing carried out by employing a preliminary polishing apparatus described in the preferred embodiment and using an aluminum plate as a metal plate for printing plate will be described.

The aluminum plate was inserted between the non-woven cloth roller and the support roller after a printing aluminum coil of 0.24 mm in thickness and 100 mm in width had been rewound from a unwinding device, and was wound up by the winding device.

The non-woven cloth roller in 300 mm in diameter and 150 mm in width was used, and silicate carbide was contained in the non-woven cloth as the polishing agent. The conditions relevant to the average particle size of the contained polishing agent, the maximum particle size thereof, and the density of the polishing agent on the fiber surface of the non-woven cloth are as shown in Table 3. That is, of all the test zones, in Examples 1 to 4, preliminary polishing was carried out by using a non-woven cloth roller formed so as to satisfy all the conditions for containing the polishing agent according to the present invention. In Comparative Examples 1 to 3 was used a non-woven cloth roller formed so as not to satisfy the conditions for containing the polishing agent according to the present invention.

A pair of rubber-based support rollers of 200 mm in diameter and 150 mm in width were used. A pair of these rollers were disposed so that the spaced distance between a pair of the support rollers is smaller than the diameter of the non-woven cloth roller. In addition, the rollers were disposed so as to rotate at a speed equal to the running speed of the aluminum plate.

Further, water was sprayed onto the surface of the aluminum plate by means of the water supply device, and the non-woven cloth roller was pushed between the support rollers by means of the forwarding and retracting device so that the polishing pressure is +2 A/100 mm.

As described above, the surface of the aluminum plate was preliminarily polished by means of the non-woven cloth roller in each of the test zones in Examples 1 to 4 and Comparative Examples 1 to 3 in which only the conditions for containing the polishing agent to be contained in the non-woven cloth roller were changed; and an occurrence of the polishing streaks at that time was visually checked.

The polishing streaks were evaluated at five stages at which "A" designates "Completely Absent," "B" designates "Almost Absent," "C" designates "Slightly Present," "D" designates "Considerably Present," and "E" designates "Very Considerably Present"; and "A" and "B" were defined as being acceptable.

TABLE 3

| Test zone | Average particle size (μm) | Maximum particle size (μm) | Density (%) | Evaluation of polishing streaks |
|---|---|---|---|---|
| Example 1 | 5 | 10 | 90 | A |
| Example 2 | 5 | 10 | 70 | A |
| Example 3 | 40 | 50 | 80 | A |
| Example 4 | 50 | 60 | 80 | B |
| Comparative Example 1 | 5 | 50 | 50 | D |
| Comparative Example 2 | 30 | 70 | 60 | D |
| Comparative Example 3 | 60 | 80 | 50 | E |

Remarks: In Table 3, the "average particle size," "maximum particle size," and "density" denote the average particle size of the polishing agent contained in the non-woven cloth of the non-woven cloth roller, the maximum particle size thereof, and the density of the polishing agent on the fiber surface of the non-woven cloth.

As is evident from the evaluation results of the polishing streaks in Table 3, in Examples 1 to 4, there was used a non-woven cloth roller formed so as to satisfy all of the conditions for containing the polishing agent according to the present invention; therefore, satisfactory results indicating that an occurrence of polishing streaks is "Completely Absent" or "Almost Absent" were obtained. In addition, the "density" following continuous 5 hours of preliminary polishing was measured, and a value equal to the "density" set prior to starting use of the non-woven cloth roller was maintained.

In contrast, in Comparative Examples 1 to 3, any or all of the "average particle size," "maximum particle size," and "density" were organized so as not to meet the conditions for containing the polishing agent according to the present invention; therefore, the polishing streaks due to the particles occurred with the polishing agent. In particular, in the case of Comparative Example 3 in which all of the "average particle size," "maximum particle size," and "density" did not meet the above conditions, a considerably large number of polishing streaks occurred.

In comparison between Example 4 and Comparative Example 1, in Comparative Example 1, the "average particle size" and "maximum particle size" met the conditions, and the "density" was slightly out of the conditions. However, the polishing streaks occurred significantly, indicative of a bad result and it is anticipated that the "density" significantly affects an occurrence of polishing streaks. However, in Comparative Example 2, even if the "density" and the "average particle size" met the conditions and the "maximum particle size" was slightly out of the conditions, the polishing streaks occurred significantly, indicative of a bad result. From the foregoing, it was found that one of the "average particle size," "maximum particle size" and "density" does not affect an occurrence of the polishing streaks particularly greatly. As in the present invention, it is required to satisfy all of the conditions relevant to the "average particle size," "maximum particle size," and "density."

Now, another preferred embodiment of the present invention will be described here.

Another preferred embodiment of the present invention is directed to a method for carrying out preliminary polishing by using the preliminary polishing apparatus 10 that is primarily constituted as described above.

According to the preliminary polishing method of the present invention, the peripheral rotation speed $V_1$ (m/minute) of the non-woven cloth roller 14, the running speed $V_2$ (m/minute) of the metal plate for printing plate 12, the average particle size D ($\mu$m) when the polishing agent contained in the non-woven cloth roller 14 is represented by a diameter corresponding to a circle, and a preliminary polishing quantity X ($\mu$m) of the metal plate for printing plate 12 are set for preliminary polishing so as to meet the formula, $5 \leqq D \times V_1 \times X / V_2 \leqq 20000$ (hereinafter, referred to as "preliminary polishing condition formula"). That is, the rotation speed $V_1$ of the non-woven cloth roller 14 is set by varying the rotation frequency of the motor 32, the running speed $V_2$ of the metal plate for printing plate 12 is set by varying the winding speed of the winding device 30, and the preliminary polishing quantity X is set by varying the pushing quantity of the forwarding and retracting device 18. In addition, the average particle size D when the polishing agent is represented by a diameter corresponding to a circle is contained in advance in the non-woven cloth 26 within the range of 1 to 100 $\mu$m in average particle size.

In this case, although a preliminary polishing condition formula may be met by changing all of $V_1$, $V_2$, D, and X, there are too many variables, which is complicated. Therefore, D and X of $V_1$, $V_2$, D, and X, are fixed. At this time, $V_1$ and $V_2$ can be changed (controlled) so as to meet the preliminary polishing condition formula. Further, D, X, and $V_2$ of $V_1$, $V_2$, D, and X are fixed, and at this time, $V_1$ can be changed (controlled) so as to meet the preliminary polishing condition formula.

According to another preferred embodiment of the present invention, the peripheral rotation speed $V_1$ (m/minute) of the non-woven cloth roller, the running speed $V_2$ (m/minute) of the metal plate for printing plate, and the average particle size D ($\mu$m) when the polishing agent contained in the non-woven cloth roller is represented by a diameter corresponding to a circle, and the preliminary polishing quantity X ($\mu$m) of the metal plate for printing plate metal plate are set for preliminary polishing so as to meet the preliminary polishing condition formula, and thus, preliminary polishing with a uniform face quantity free of preliminary polishing non-uniformity on the surface of the metal plate for printing plate can be performed. Further, when preliminary polishing satisfying the preliminary polishing condition formula is performed, impurities such as Cu and Fe segregated at the top layer portion of the metal plate for printing plate 12 do not remain, and thus, graining failures caused by impurities during polishing can be prevented.

Examples

The test results in which preliminary polishing method of the present invention is performed by employing the preliminary polishing apparatus described in the preferred embodiment and using an aluminum plate as a metal plate for printing plate, will be described.

The aluminum plate was inserted between the non-woven cloth roller and the support roller by rewinding a printing aluminum coil of 0.24 mm in thickness and 100 mm in width from the unwinding device, and was wound around the winding device. The non-woven cloth roller in 300 mm in diameter and 150 mm in width was used, and silicate carbide of 7 $\mu$m in average particle size when it is represented by a diameter corresponding to a circle was employed as the polishing agent contained in the non-woven cloth. A pair of rubber-based support rollers of 200 mm in diameter was disposed with a spaced distance smaller than the diameter of the non-woven cloth roller so as to rotate the roller at a speed identical to the running speed of the aluminum plate. Then, the non-woven cloth roller was pressurized to the aluminum plate by means of forwarding and retracting device so that the polishing pressure is set to +3 A/100 mm, and preliminary polishing quantity was set.

The peripheral rotation speed $V_1$ (m/minute) of the non-woven cloth roller and the running speed $V_2$ (m/minute) of the aluminum plate were changed, and an occurrence of the preliminary polishing non-uniformity and the state of graining properties in polishing was visually observed.

Examples 1 to 5 shown in Table 4 show a case where $V_1$ and $V_2$ are changed so as to satisfy the preliminary polishing conditions, and Comparative Examples 1 to 4 show a case where $V_1$ and $V_2$ are changed so as not to satisfy the preliminary polishing conditions.

The preliminary polishing non-uniformity was evaluated at five stages where "A" designates "Completely Absent," "B" designates "Almost Absent," "C" designates "Slightly Present," "D" designates "Considerably Present," "E" designates "Very Considerably Present"; and the graining properties were evaluated at five stages where "A" designates "Good," "B" designates "Slightly Good," "C" designates "Slightly Inferior," "D" designates "Inferior," and "E" designates "Very Inferior". The preliminary polishing non-uniformity and graining properties represented by "A" and "B" were defined as having been acceptable.

TABLE 4

| | Preliminary polishing condition formula | Preliminary polishing non-uniformity | Graining properties |
|---|---|---|---|
| Example 1 | 5 | B | B |
| Example 2 | 150 | B | B |
| Example 3 | 1300 | A | A |
| Example 4 | 12500 | A | A |
| Example 5 | 20000 | B | A |
| Comparative Example 1 | 1 | E | E |
| Comparative Example 2 | 4 | C | D |
| Comparative Example 3 | 25000 | C | A |
| Comparative Example 4 | 30000 | D | A |

As is evident from the results shown in Table 4, in the case of Examples 1 to 5 that satisfy the preliminary polishing condition formula, there was almost no preliminary polishing non-uniformity, and the graining properties were acceptable. In particular, in the case where the numeric values in the preliminary polishing condition formula were 1300 and 12500, there was no preliminary polishing non-uniformity, and the graining properties were acceptable. From the foregoing, it is considered that further better results will be obtained when a condition of $1300 \leqq D \times V_1 \times X / V_2 \leqq 12500$ is met.

In contrast, in the case of Comparative Examples 1 to 4 that do not satisfy the preliminary polishing condition formula, there were considerable preliminary polishing non-uniformity, and the graining properties were unacceptable. In particular, in Comparative Examples 1 and 2 in which the numeric value in the preliminary polishing condition formula is less than 5. the graining properties were within the range of "Inferior" and "Very Inferior," and were bad.

As has been described above, a planographic printing plate according to the present invention comprises: preliminarily polishing a surface of an aluminum plate being a support element of a planographic printing plate mechanically by at least 0.1 $\mu$m; carrying out chemically etching treatment by at least 0.1 $\mu$m; electrochemically roughening the surface thereof; and anodic oxidation, a surface structure of the aluminum plate experienced in the process is characterized in that:

(a) an area (S) for a graphic formed by a reference straight line drawn from a top of a third highest mountain of a two-dimensional roughness curve downwardly by 1 $\mu$m and a roughness curve above the reference straight line is 30 $\mu m^2 \leqq S \leqq 150$ $m^2$;

(b) an average roughness Ra of average lines is 0.15 $\mu m \leqq Ra \leqq 0.60$ $\mu$m;

(c) a relationship between the average roughness Ra of average lines and a height Rp of a center line is $Rp \leqq 6Ra$;

(d) a relationship between a maximum height Rmax and the average roughness Ra of average lines is $Rmax \leqq 12Ra$; and (e) a surface area difference is between 20% to 70%.

Thus, improvement of productivity and stability of the small dot net portion due to improvement of adhesion can be ensured.

In addition, according to the present invention, polishing streaks caused by particles of the polishing agent can be prevented or suppressed from occurring on the surface of the metal plate for printing plate in preliminary polishing, and graining failures while in polishing can be prevented.

Further, according to the present invention, in preliminary polishing, preliminary polishing non-uniformity does not occur on the surface of the metal plate for printing plate, and the graining failure while in polishing can be prevented.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A planographic printing plate, a surface of an aluminum plate being a support element of said planographic printing plate having been subjected to preliminarily polishing mechanically by at least 0.1 $\mu$m, chemical etching treatment by at least 0.1 $\mu$m, electrochemically surface-roughening, and anodic oxidation, wherein a surface structure of said aluminum plate is characterized in that:

(a) an area (S) for a graphic formed by a reference straight line drawn from a top of a third highest mountain of a two-dimensional roughness curve downwardly by 1 $\mu$m and a roughness curve above the reference straight line is 30 $\mu m^2 \leqq S \leqq 150$ $\mu m_2$;

(b) an average roughness Ra of average lines is 0.15 $\mu m \leqq Ra \leqq 0.60$ $\mu$m;

(c) a relationship between the average roughness Ra of average lines and a height Rp of a center line is $Rp \leqq 6Ra$;

(d) a relationship between a maximum height Rmax and the average roughness Ra of average lines is $Rmax \leqq 12Ra$; and (e) a surface area difference is between 20% and 70%.

* * * * *

UNITED STATES PATENT AND TRADEMARK OFFICE

CERTIFICATE OF CORRECTION

PATENT NO. : 6,475,630 B1 
DATED : November 5, 2002
INVENTOR(S) : Akio Uesugi, Masahiro Endo and Yoshinori Hotta It is certified that error appears in the above-identified patent and that said Letters Patent is hereby corrected as shown below:

<u>Column 33,</u>
Line 5, please delete "30 $\mu m^2 \leq S \leq 150\ m^2$" and insert therefor -- 30 $\mu m^2 \leq S \leq 150\ \mu m^2$ --.

<u>Column 34,</u>
Line 17, please delete "30 $\mu m^2 \leq S \leq 150\ \mu m_2$" and insert therefor -- 30 $\mu m^2 \leq S \leq 150\ \mu m^2$ --.

Signed and Sealed this

First Day of April, 2003

JAMES E. ROGAN
*Director of the United States Patent and Trademark Office*